US012696670B2

(12) United States Patent
  Cho

(10) Patent No.: US 12,696,670 B2
(45) Date of Patent: Jul. 28, 2026

---

(54) WINDOW AND DISPLAY APPARATUS INCLUDING METAL FLUORIDE CONTAINING LOW-REFRACTIVE LAYER

(71) Applicant: SAMSUNG DISPLAY CO., LTD., Yongin-si (KR)

(72) Inventor: Jonghwan Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 434 days.

(21) Appl. No.: 18/131,293

(22) Filed: Apr. 5, 2023

(65) Prior Publication Data

US 2023/0329071 A1 Oct. 12, 2023

(30) Foreign Application Priority Data

Apr. 8, 2022 (KR) ........................ 10-2022-0044074

(51) Int. Cl.
  *H10K 59/80* (2023.01)
  *H10K 50/844* (2023.01)
  *H10K 59/12* (2023.01)
  *H10K 59/124* (2023.01)
  *H10K 59/126* (2023.01)
  *H10K 59/40* (2023.01)

(52) U.S. Cl.
  CPC ....... *H10K 59/8791* (2023.02); *H10K 59/873* (2023.02); *H10K 50/844* (2023.02); *H10K 59/12* (2023.02); *H10K 59/124* (2023.02); *H10K 59/126* (2023.02); *H10K 59/40* (2023.02)

(58) Field of Classification Search
  CPC .. H10K 50/841; H10K 50/805; H10K 50/858; H10K 50/865; H10K 50/844; H10K 59/8791; H10K 59/873; H10K 59/12; H10K 59/38; H10K 59/879; H10K 59/122; H10K 59/40; H10K 59/124; H10K 59/126
  See application file for complete search history.

(56) References Cited

U.S. PATENT DOCUMENTS

| | | | | |
|---|---|---|---|---|
| 7,221,508 | B2 * | 5/2007 | Maruta | ................... G03B 21/60 |
| | | | | 359/493.01 |
| 8,159,748 | B2 | 4/2012 | Fukui et al. | |
| 9,335,444 | B2 | 5/2016 | Hart et al. | |
| 9,703,011 | B2 | 7/2017 | Adib et al. | |
| 10,822,271 | B2 | 11/2020 | Adib et al. | |
| 2002/0187371 | A1 * | 12/2002 | Nakajima | ............. C23C 16/545 |
| | | | | 427/255.28 |

(Continued)

FOREIGN PATENT DOCUMENTS

| | | | | | |
|---|---|---|---|---|---|
| JP | | 2581651 | B2 * | 2/1997 | ............. C03C 3/325 |
| JP | | 2000028809 | A * | 1/2000 | ............... G02B 5/08 |

(Continued)

OTHER PUBLICATIONS https://materion.com/resource-center/product-data-and-relatedliterature/inorganic-chemicals/fluorides/magnesium-fluoride-mgf2-foropticalcoating (Retrieved on Mar. 29, 2023); 1 page.

(Continued)

*Primary Examiner* — Ida M Soward
(74) *Attorney, Agent, or Firm* — CANTOR COLBURN LLP

(57) ABSTRACT

A window includes: a substrate; a low-refractive layer disposed on the substrate and including a metal fluoride; a first functional layer disposed on the low-refractive layer, having a thickness of about 5 nm to about 25 nm, and including an oxide; and a second functional layer disposed on the first functional layer and including perfluorinated compound.

30 Claims, 11 Drawing Sheets

(56) References Cited

U.S. PATENT DOCUMENTS

| | | | |
|---|---|---|---|
| 2007/0053062 A1* | 3/2007 | Sasaki | G02B 1/111 |
| | | | 359/582 |
| 2008/0206470 A1 | 8/2008 | Thomas et al. | |
| 2010/0215932 A1* | 8/2010 | Schreiber | G02B 5/0833 |
| | | | 428/428 |
| 2013/0194211 A1* | 8/2013 | Shinohara | G02B 5/3083 |
| | | | 345/173 |
| 2014/0184994 A1* | 7/2014 | Kuroda | G02B 5/3083 |
| | | | 427/163.1 |
| 2017/0219848 A1* | 8/2017 | Kraus | G02C 7/107 |
| 2017/0269266 A1 | 9/2017 | Adib et al. | |
| 2019/0033494 A1 | 1/2019 | Kim et al. | |
| 2021/0066648 A1 | 3/2021 | Chung et al. | |
| 2023/0039752 A1* | 2/2023 | Hagen | C03C 17/3417 |

FOREIGN PATENT DOCUMENTS

| | | | | |
|---|---|---|---|---|
| JP | 2005181834 A | 7/2005 | | |
| JP | 2006330076 A | * 12/2006 | | G02B 1/11 |
| JP | 4462273 | 2/2010 | | |
| KR | 1020130052108 A | 5/2013 | | |
| KR | 101478635 B1 | 1/2015 | | |
| KR | 1020160005076 A | 1/2016 | | |
| KR | 1020170091396 A | 8/2017 | | |
| KR | 1020190012847 A | 2/2019 | | |
| KR | 1020200004369 A | 1/2020 | | |
| KR | 1020200138831 A | 12/2020 | | |
| KR | 1020210028296 A | 3/2021 | | |
| KR | 102236343 B1 | 4/2021 | | |
| WO | 2014199991 A1 | 12/2014 | | |

OTHER PUBLICATIONS

Hyeon-Hun Yang; "A Study on Properties of MgF2 antireflection film for solar cell" Proceedings of the KIEE Conference 2009, pp. 14-17.

Jin-Cherng Hsu; "MgF2 Film Deposited by IAD with end-Hall Ion Source Using SF6 as Working Gas" Key Engineering Materials vols. 364-366 (2008) pp. 762-767.

* cited by examiner

1

WINDOW AND DISPLAY APPARATUS INCLUDING METAL FLUORIDE CONTAINING LOW-REFRACTIVE LAYER

This application claims priority to Korean Patent Application No. 10-2022-0044074, filed on Apr. 8, 2022, and all the benefits accruing therefrom under 35 U.S.C. § 119, the content of which in its entirety is herein incorporated by reference.

BACKGROUND

1. Field

One or more embodiments relate to a window and a display apparatus including the same, and more particularly, to a window with a reduced reflectivity, and a display apparatus including the same.

2. Description of the Related Art

Usage of a display apparatus has diversified. In addition, as the display apparatus has become thinner and lighter, their range of use has gradually been extended.

As the display apparatus is variously utilized, there may be various methods of designing the shape of the display apparatus, and also, functions that may be combined or associated with the display apparatus have increased.

SUMMARY

One or more embodiments include a display apparatus configured to prevent or reduce visibility from being deteriorated. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a window includes a substrate, a low-refractive layer disposed on the substrate and including a metal fluoride, a first functional layer disposed on the low-refractive layer, having a thickness of about 5 nanometers (nm) to about 25 nm, and including an oxide, and a second functional layer disposed on the first functional layer and including perfluorinated compound.

The low-refractive layer may include magnesium fluoride.

The low-refractive layer may have a refractive index of about 1.2 to about 1.4.

The low-refractive layer may have a thickness of about 50 nm to about 150 nm.

The low-refractive layer may have a crystalline structure.

The first functional layer may include a silicon-aluminum oxide.

The first functional layer may include a silicon oxide in which aluminum atoms are employed.

The first functional layer may include a substitution-type solid solution in which some of silicon atoms of the silicon oxide are replaced by the aluminum atoms.

The first functional layer may include a penetration-type solid solution in which the aluminum atoms penetrate a crystalline lattice of the silicon oxide.

The first functional layer may include an aluminum oxide in which a silicon atom is employed.

The first functional layer may include a substitution-type solid solution in which some of aluminum atoms of the aluminum oxide are replaced by the silicon atoms.

The first functional layer may have a refractive index of about 1.4 to about 1.6.

The second functional layer may have a thickness of about 5 nm to about 30 nm.

The window may further include a third functional layer disposed between the substrate and the low-refractive layer and including an oxide.

The third functional layer may include one of yttrium oxide, magnesium oxide, and aluminum oxide.

A refractive index of the third functional layer may be greater than a refractive index of the low-refractive layer.

The third functional layer may have a refractive index of about 1.6 to about 1.8.

The third functional layer may have a thickness of about 5 nm to about 30 nm.

After applying a load of 1 kilogram (Kg) to a surface of the window using an eraser, and reciprocating a distance of 15 millimeters (mm) at a speed of 40 cycles per minute (cycles/min) 6000 times, a contact angle of the surface of the window with respect to water may be about 95° or more.

According to one or more embodiments, a display apparatus includes a display panel, and a window disposed on the display panel, where the display panel includes a display substrate, a light-emitting element disposed over the display substrate, and a filter layer disposed on the light-emitting element and including a color filter layer and a light-blocking layer. The window includes a substrate, a low-refractive layer disposed on the substrate and including a metal fluoride, a first functional layer disposed on the low-refractive layer, having a thickness of about 5 nm to about 25 nm, and including an oxide, and a second functional layer disposed on the first functional layer and including perfluorinated compound.

The light-emitting element may include a pixel electrode, an emission layer, and an opposite electrode, and the display apparatus may further include a pixel-defining layer that defines a first opening exposing at least a portion of the pixel electrode.

A second opening may be defined in the light-blocking layer, wherein the second opening overlaps the first opening.

At least a portion of the color filter layer may be located inside the second opening.

The low-refractive layer may include magnesium fluoride, have a refractive index of 1.2 to 1.4, and have a thickness of 50 nm to 150 nm.

The first functional layer may include a silicon-aluminum oxide.

The first functional layer may include a silicon oxide in which aluminum atoms are employed.

The first functional layer may include a substitution-type solid solution in which some of silicon atoms of the silicon oxide are replaced by the aluminum atoms, or a penetration-type solid solution in which the aluminum atoms penetrate a crystalline lattice of the silicon oxide.

The window may further include a third functional layer disposed between the substrate and the low-refractive layer and including an oxide.

A refractive index of the third functional layer may be greater than a refractive index of the low-refractive layer.

After applying a load of 1 Kg to a surface of the window using an eraser, and reciprocating a distance of 15 mm at a speed of 40 cycles/min 6000 times, a contact angle of the surface of the window with respect to water may be about 95° or more.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
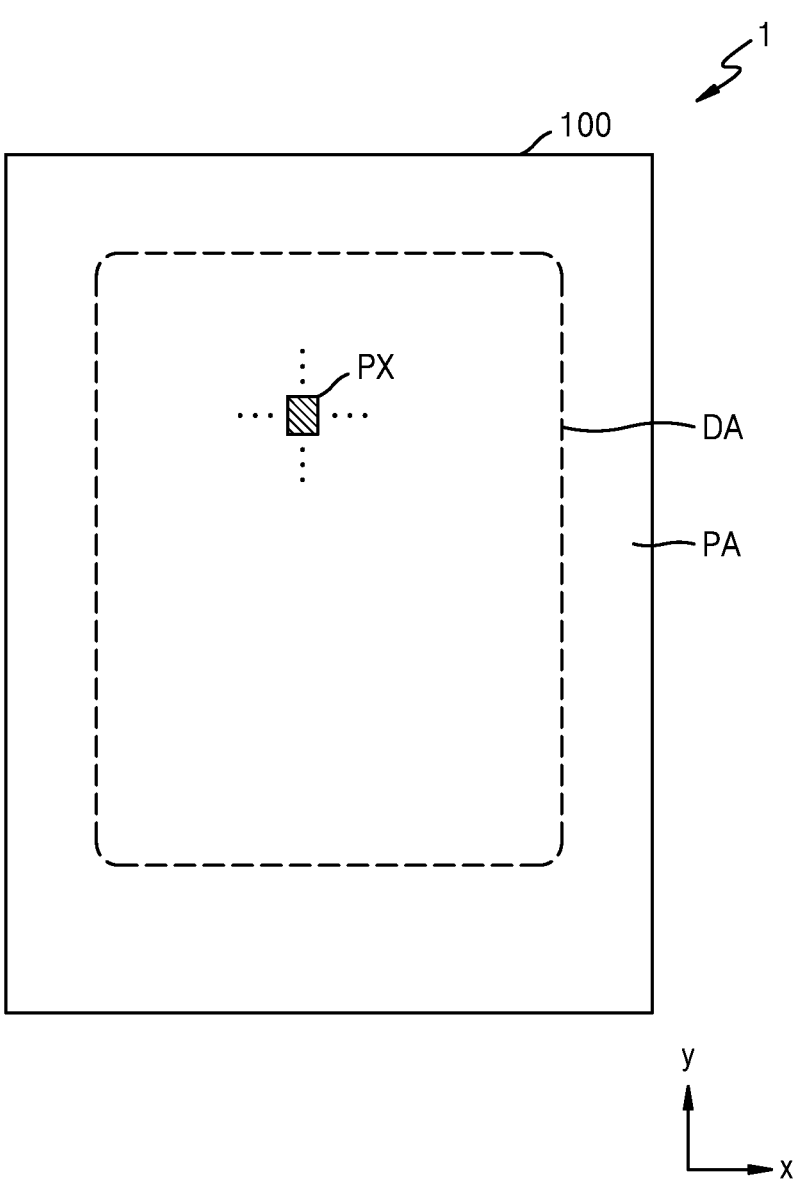
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

In the present specification, "Or" means "and/or." "A and/or B" means A or B, or A and B. In the present specification, "at least one of A and B" means A or B, or A and B.

As used herein, when a wiring is referred to as "extending in a first direction or a second direction," it means that the wiring not only extends in a straight line shape but also extends in a zigzag or in a curve in the first direction or the second direction.

As used herein, "on a plan view" means that an objective portion is viewed from above, and "on a cross-sectional view" means that a cross-section of an objective portion taken vertically is viewed from a lateral side. As used herein, "overlapping" includes overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments of the present disclosure are described in detail with reference to the accompanying drawings. When description is made with reference to the drawings, like reference numerals are used for like or corresponding elements.

FIG. 1 is a schematic plan view of a display apparatus 1 according to an embodiment.

Referring to FIG. 1, the display apparatus 1 includes a display area DA configured to display images and a peripheral area PA arranged around the display area DA. The display apparatus 1 may display images to outside by using light emitted from the display area DA. Alternatively, because the display apparatus 1 includes a display substrate 100, it may be understood that the display substrate 100 includes the display area DA and the peripheral area PA.

The display substrate 100 may include various materials such as glass, metal, or plastic. In an embodiment, the display substrate 100 may include a flexible material. Here, the flexible material may be a material that is easily warped, bendable, foldable, or rollable. The display substrate 100 of the flexible material may include ultra-thin glass, metal, or plastic.

Pixels PX may be arranged in the display area DA of the display substrate 100, wherein the pixels PX each include a light-emitting element such as an organic light-emitting diode OLED. The pixel PX may be provided in plurality. The plurality of pixels PX may be arranged in various configurations such as a stripe configuration, a pentile configuration, a mosaic configuration, and the like to display images. Hereinafter, though it is described that the display apparatus 1 according to an embodiment includes a light-emitting element, and the light-emitting element is an organic light-emitting diode, the embodiment is not limited thereto. As an example, a light-emitting element may be an inorganic light-emitting diode, a quantum-dot light-emitting diode, and the like.

Though it is shown in FIG. 1 that the planar shape of the display area DA is rectangular, the embodiment is not limited thereto. As an example, the display area DA may be provided in a polygonal shape such as a triangle, a pentagon, a hexagon, and the like, a circular shape, an elliptical shape, an irregular shape, or the like.

The peripheral area PA of the display substrate 100 is a region arranged around the display area DA and may be a region in which images are not displayed. Pads may be arranged in the peripheral area PA, wherein various wirings, a printed circuit board or a driver integrated circuit ("IC") chip configured to transfer electric signals to the display area DA are attached to the pads.

Figure 2:
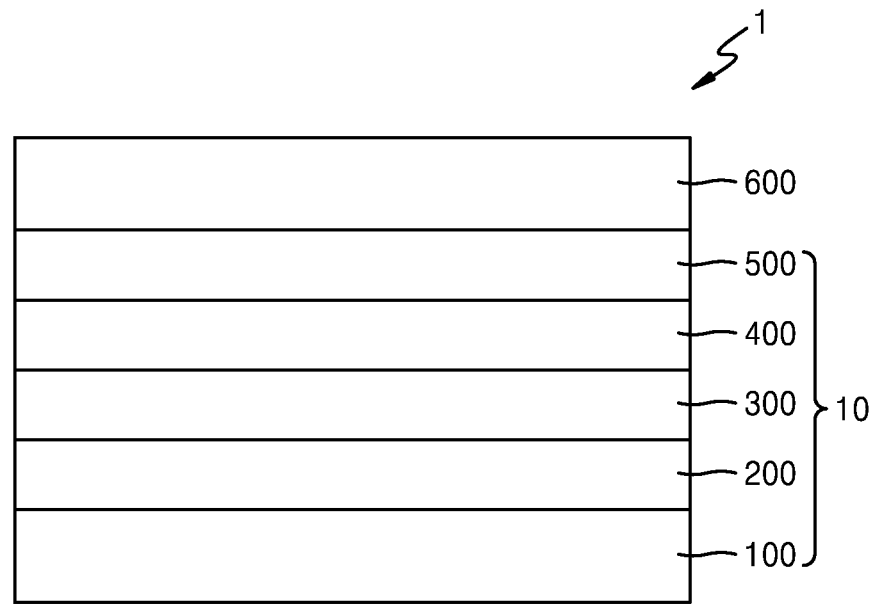
FIG. 2 is a schematic cross-sectional view of the display apparatus according to an embodiment.

FIG. 2 is a schematic cross-sectional view of the display apparatus 1 according to an embodiment.

Referring to FIG. 2, the display apparatus 1 may include a display panel 10 and a window 600. The window 600 may be disposed on the display panel 10. The display panel 10 may include the display substrate 100, a display layer 200, an encapsulation layer 300, an input sensing layer 400, and a filter layer 500 that are sequentially stacked. Because the display apparatus 1 includes the display panel 10, it may be understood that the display apparatus 1 includes the display substrate 100, the display layer 200, the encapsulation layer 300, the input sensing layer 400, and the filter layer 500 that are sequentially stacked.

The display substrate 100 may include a glass material, a ceramic material, metal, or a flexible or bendable material. In the case where the display substrate 100 is flexible or bendable, the display substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate.

The display substrate 100 may have a single-layered structure or a multi-layered structure of the above materials, and may further include an inorganic layer in the case of the multi-layered structure. Alternatively, the display substrate 100 may have a structure of an organic material/inorganic material/organic material/inorganic material.

The display layer 200 may be disposed on the display substrate 100. The display layer 200 may include a thin-film transistor, a light-emitting element, inorganic insulating layers, and organic insulating layers.

The encapsulation layer 300 may be disposed on the display layer 200. The encapsulation layer 300 may include at least one inorganic layer and at least one organic layer. Alternatively, the encapsulation layer 300 may include an encapsulation substrate including glass. In the case where the encapsulation layer 300 includes glass, sealant including frit and the like may be disposed between the display substrate 100 and the encapsulation layer 300. The sealant may be arranged in the peripheral area PA (see FIG. 1). The sealant arranged in the peripheral area PA may surround the display area DA and prevent or reduce moisture from penetrating through the lateral surface of the display apparatus 1.

The input sensing layer 400 may be disposed on the encapsulation layer 300. The input sensing layer 400 may obtain coordinate information corresponding to an external input, for example, a touch event. The input sensing layer 400 may be separately formed on a touch substrate and then adhered to the encapsulation layer 300 through an adhesive layer such as an optically clear adhesive OCA. Alternatively, the input sensing layer 400 may be directly formed on the encapsulation layer 300. In this case, the adhesive layer may not be disposed between the input sensing layer 400 and the encapsulation layer 300.

In an embodiment, the filter layer 500 may be disposed on the input sensing layer 400. As described below with reference to FIG. 3, the filter layer 500 may include a light-blocking layer 510 (see FIG. 3), a color filter layer 520 (see FIG. 3), and an overcoat layer 530 (see FIG. 3). This is described in more detail in FIG. 3.

In an embodiment, the window 600 may be disposed on the filter layer 500. As described below with reference to FIG. 4, the window 600 may include a substrate 610 (see FIG. 4), a low-refractive layer 620 (see FIG. 4), a first functional layer 630 (see FIG. 4), and a second functional layer 640 (see FIG. 4). This is described in more detail in FIG. 4.

Figure 3:
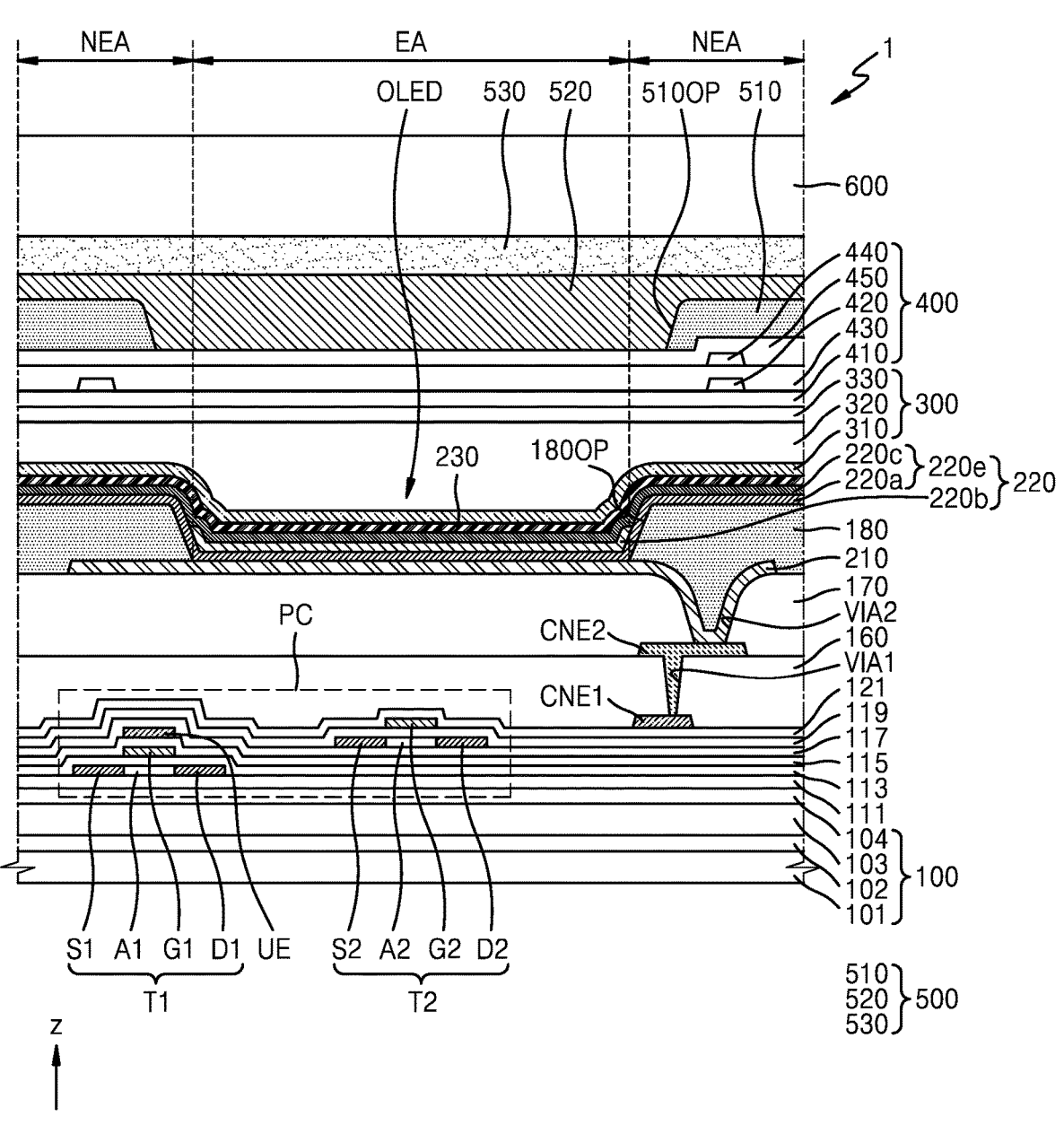
FIG. 3 is a schematic cross-sectional view of a display apparatus according to an embodiment.

FIG. 3 is a schematic cross-sectional view of a display apparatus according to an embodiment. Specifically, FIG. 3 is a cross-sectional view of elements arranged in the display area DA (see FIG. 1).

Referring to FIG. 3, the display apparatus 1 may include the display substrate 100, the light-emitting element OLED, and the filter layer 500. In this case, the light-emitting element OLED may be an organic light-emitting diode.

In addition, a pixel circuit PC may be disposed over the display substrate 100. Though it is shown in FIG. 3 that the pixel circuit PC includes two transistors, the embodiment is not limited thereto. The pixel circuit PC may include three or more transistors. As an example, the pixel circuit PC may include seven transistors or nine transistors.

The display substrate 100 may have a structure in which a layer including an organic material and a layer including an inorganic material are alternately stacked. As an example, the display substrate 100 may include a first base layer 101, a first barrier layer 102, a second base layer 103, and a second barrier layer 104 that are sequentially stacked. However, the embodiment is not limited thereto. The display substrate 100 may include glass.

The first base layer 101 and the second base layer 103 may each include an organic material. As an example, the first base layer 101 and the second base layer 103 may each include one of polyimide, polyethylene naphthalate, polyethylene terephthalate, polyarylate, polycarbonate, polyetherimide, and polyethersulfone. The first base layer 101 and the second base layer 103 may include the same material or different materials.

The first barrier layer 102 may be disposed between the first base layer 101 and the second base layer 103. In addition, the second barrier layer 104 may be disposed on the second base layer 103. The first barrier layer 102 and the second barrier layer 104 may each include an inorganic material. As an example, the first barrier layer 102 and the second barrier layer 104 may each include silicon oxide, silicon oxynitride, silicon nitride, amorphous silicon, or the like. In an embodiment, the first barrier layer 102 may include two layers including different materials. In this case, the refractive indexes of the two layers may be different from each other. As an example, the first barrier layer 102 may include two layers including silicon oxynitride and silicon oxide having a refractive index less than that of silicon oxynitride. However, the embodiment is not limited thereto.

A buffer layer 111 may be disposed on the display substrate 100. The buffer layer 111 may reduce or block penetration of foreign materials, moisture, or external air from below the display substrate 100. The buffer layer 111 may include an inorganic material such as silicon nitride, silicon oxynitride, and silicon oxide, and include a single layer or a multi-layer including the above inorganic materials.

A semiconductor pattern may be disposed on the buffer layer 111. Hereinafter, a semiconductor pattern directly disposed on the buffer layer 111 is defined as a first semiconductor pattern. The first semiconductor pattern may include a silicon semiconductor. The first semiconductor pattern may include polycrystalline silicon. However, the embodiment is not limited thereto. As an example, the first semiconductor pattern may include amorphous silicon. Alternatively, the first semiconductor pattern may include an oxide semiconductor. In this case, the oxide semiconductor may include crystalline or amorphous oxide semiconductor.

The first semiconductor pattern may include a doped region and a non-doped region. The doped region may be doped with N-type dopants or P-type dopants. A P-type transistor may include a doped region doped with P-type dopants.

A first transistor T1 may include a source S1, an active A1, and a drain D1. The source S1, the active A1, and the drain D1 of the first transistor T1 may include a first semiconductor pattern. The source S1 may be apart from drain D1 of the first transistor T1 with the active A1 of the first transistor T1 therebetween.

A first insulating layer 113 may be disposed on the buffer layer 111. The first insulating layer 113 may cover the first semiconductor pattern. In an embodiment, the first insulating layer 113 may include an inorganic material such as silicon nitride, silicon oxynitride, and silicon oxide, and include a single layer or a multi-layer including the above inorganic materials.

A gate G1 of the first transistor T1 may be disposed on the first insulating layer 113. The gate G1 may be a portion of a metal pattern. The gate G1 of the first transistor T1 may overlap at least a portion of the first semiconductor pattern disposed therebelow. As an example, the gate G1 may overlap the active A1 disposed therebelow. The gate G1 may include a conductive material of a low-resistance, such as molybdenum (Mo), aluminum (Al), copper (Cu) and/or titanium (Ti), and have a single-layered structure or a multi-layered structure including the above materials.

A second insulating layer 115 may be disposed on the first insulating layer 113. The second insulating layer 115 may cover the gate G1 of the first transistor T1 disposed on the first insulating layer 113. The second insulating layer 115 may include an inorganic material such as silicon nitride, silicon oxynitride, and silicon oxide, and include a single layer or a multi-layer including the above inorganic materials.

An upper electrode UE may be disposed on the second insulating layer 115. The upper electrode UE may overlap at least a portion of the gate G1 of the first transistor T1 disposed therebelow. The upper electrode UE may be a portion of a metal pattern or a portion of a doped semiconductor pattern. A portion of the gate G1 and the upper electrode UE overlapping each other may constitute a storage capacitor. However, the upper electrode UE may be omitted.

A third insulating layer 117 may be disposed on the second insulating layer 115. The third insulating layer 117 may cover the upper electrode UE disposed on the second insulating layer 115. The third insulating layer 117 may include an inorganic material such as silicon nitride, silicon oxynitride, and silicon oxide, and include a single layer or a multi-layer including the above inorganic materials. In an embodiment, the third insulating layer 117 may include a plurality of silicon oxide layers and silicon nitride layers that are alternately stacked.

A semiconductor pattern may be disposed on the third insulating layer 117. Hereinafter, a semiconductor pattern directly disposed on the third insulating layer 117 is defined as a second semiconductor pattern. The second semiconductor pattern may include an oxide semiconductor. The oxide semiconductor may include a crystalline or amorphous oxide semiconductor. However, the embodiment is not limited thereto. The second semiconductor pattern may include a silicon semiconductor. As an example, the second semiconductor pattern may include polycrystalline silicon or amorphous silicon.

The oxide semiconductor may include at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). Alternatively, the oxide semiconductor may include at least one of indium-tin oxide ("ITO"), indium-gallium-zinc oxide ("IGZO"), zinc oxide (ZnO), indium-zinc oxide (IZnO), zinc-indium oxide ("ZIO"), indium oxide (InO), titanium oxide (TiO), indium-zinc-tin oxide ("IZTO"), zinc-tin oxide ("ZTO"), and the like.

A second transistor T2 may include a source S2, an active A2, and a drain D2. The source S2, the active A2, and the drain D2 of the second transistor T2 may include the second semiconductor pattern. The source S2 and the drain D2 of the second transistor T2 may include metal reduced from a metal oxide semiconductor. The source S2 and the drain D2 of the second transistor T2 may include a metal layer having a preset thickness from the upper surface of the second semiconductor pattern and including a reduced metal.

A fourth insulating layer 119 may be disposed on the third insulating layer 117. The fourth insulating layer 119 may cover the second semiconductor pattern disposed on the third insulating layer 117. The fourth insulating layer 119 may include an inorganic material such as silicon nitride, silicon oxynitride, and silicon oxide, and include a single layer or a multi-layer including the above inorganic materials.

Though not shown, the fourth insulating layer 119 may be patterned to correspond to a gate G2 of the second transistor T2 disposed on the fourth insulating layer 119. That is, the gate G2 and the fourth insulating layer 119 may be provided in the same shape in a plan view. However, the embodiment is not limited thereto.

The gate G2 of the second transistor T2 may be disposed on the fourth insulating layer 119. The gate G2 may be a portion of a metal pattern. The gate G2 of the second transistor T2 may overlap at least a portion of the second semiconductor pattern disposed below the gate G2. As an example, the gate G2 may overlap the active A2 disposed below the gate G2. The gate G2 may include a conductive material of a low-resistance material such as molybdenum (Mo), aluminum (Al), copper (Cu) and/or titanium (Ti), and have a single-layered structure or a multi-layered structure including the above materials.

A fifth insulating layer 121 may be disposed on the fourth insulating layer 119. The fifth insulating layer 121 may cover the gate G2 disposed on the fourth insulating layer 119. The fifth insulating layer 121 may include an inorganic material such as silicon nitride, silicon oxynitride, and silicon oxide, and include a single layer or a multi-layer including the above inorganic materials. In an embodiment, the fifth insulating layer 121 may include a plurality of silicon oxide layers and silicon nitride layers that are alternately stacked.

Though it is shown in FIG. 3 that the second semiconductor pattern is disposed on the third insulating layer 117, the embodiment is not limited thereto. The second semiconductor pattern may be omitted. In this case, the source S2, the active A2, and the drain D2 of the second transistor T2 may include the first semiconductor pattern. That is, the source S2, the active A2, and the drain D2 of the second transistor T2 may be disposed on the same layer as a layer on which the source S1, the active A1, and the drain D1 of the first transistor T1 are disposed.

At least one organic insulating layer may be disposed on the fifth insulating layer 121. A first organic insulating layer 160 and a second organic insulating layer 170 may be disposed on the fifth insulating layer 121. The first organic insulating layer 160 and the second organic insulating layer 170 may include a single layer of at least one of polyimide-based resin, acrylic resin, methacrylic resin, polyisoprene, vinyl-based resin, epoxy-based resin, urethane-based resin, and cellulose-based resin, a siloxane-based resin, a polyamide-based resin, and a perylene-based resin.

In an embodiment, the first organic insulating layer 160 and the second organic insulating layer 170 may include different materials. As an example, the first organic insulating layer 160 may include siloxane-based resin, and the second organic insulating layer 170 may include a polyimide-based resin. Alternatively, the first organic insulating layer 160 may include a polyimide-based resin, and the second organic insulating layer 170 may include a siloxane-based resin. However, the embodiment is not limited thereto. As an example, the first organic insulating layer 160 may include the same material as that of the second organic insulating layer 170.

A first connection electrode CNE1 may be disposed on the fifth insulating layer 121. A second connection electrode CNE2 may be disposed on the first organic insulating layer 160. The second connection electrode CNE2 may be connected to the first connection electrode CNE1 through a first via hole VIA1 defined in the first organic insulating layer 160.

The light-emitting element OLED may be disposed on the second organic insulating layer 170. In an embodiment, the light-emitting element OLED may be an organic light-emitting diode. The light-emitting element OLED may include a pixel electrode 210, an intermediate layer 220, and an opposite electrode 230 that are sequentially stacked. The pixel electrode 210 may be disposed on the second organic insulating layer 170.

A pixel-defining layer 180 may be disposed on the second organic insulating layer 170 and the pixel electrode 210, wherein a first opening 1800P that exposes at least a portion of the pixel electrode 210 is defined in the pixel-defining layer 180. An emission area EA of light emitted from the first opening 1800P of the pixel-defining layer 180, may be defined by the first opening 1800P of the pixel-defining layer 180. As an example, the width of the first opening 1800P may correspond to the width of the emission area EA. The surroundings of the emission area EA is a non-emission area NEA, which may surround the emission area EA.

The pixel-defining layer 180 may include an organic insulating material. Alternatively, the pixel-defining layer 180 may include an inorganic insulating material, such as silicon oxide, silicon oxynitride, and silicon nitride. Alternatively, the pixel-defining layer 180 may include an organic insulating material and an inorganic insulating material. In an embodiment, the pixel-defining layer 180 may include a light-blocking material. The light-blocking material may include carbon black, carbon nanotubes, a resin or paste including black dye, metal particles, for example, nickel, aluminum, molybdenum, and an alloy thereof, metal oxide particles (e.g., chrome oxide) or metal nitride particles (e.g., chrome nitride). In the case where the pixel-defining layer 180 includes a light-blocking material, external light reflection by a metal structure arranged below the pixel-defining layer 180 may be reduced.

Though not shown, a spacer may be disposed on the pixel-defining layer 180. The spacer may include an organic insulating material such as polyimide. Alternatively, the spacer may include an inorganic insulating material such as silicon nitride or silicon oxide, or include an organic insulating material and an inorganic insulating material.

In an embodiment, the spacer may include the same material as that of the pixel-defining layer 180. In this case, the pixel-defining layer 180 and the spacer may be formed together during a mask process that uses a half-tone mask and the like. However, the embodiment is not limited thereto. As an example, the spacer may include a material different from that of the pixel-defining layer 180.

The pixel electrode 210 may be disposed on the second organic insulating layer 170. The pixel electrode 210 may be electrically connected to the second connection electrode CNE2 through a second via hole VIA2 defined in the second organic insulating layer 170. The pixel electrode 210 may include a conductive oxide including indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In an embodiment, the pixel electrode 210 may further include a layer on/under the reflective layer, the layer including ITO, IZO, $ZnO_x$, or $In_2O_3$. As an example, the pixel electrode 210 may have a multi-layered structure of ITO/Ag/ITO.

The intermediate layer 220 may be disposed on the pixel electrode 210. The intermediate layer 220 may include a first auxiliary layer 220a, an emission layer 220b, and a second auxiliary layer 220c that are sequentially stacked. The first auxiliary layer 220a and the second auxiliary layer 220c may be collectively referred to as an organic functional layer 220e.

The emission layer 220b may be disposed inside the first opening 1800P of the pixel-defining layer 180. The emission layer 220b may include a polymer organic material or a low-molecular weight organic material emitting light having a preset color.

The organic functional layer 220e may include at least one of the first auxiliary layer 220a and the second auxiliary layer 220c, wherein the first auxiliary layer 220a is located between the pixel electrode 210 and the emission layer 220b, and the second auxiliary layer 220c is located between the emission layer 220b and the opposite electrode 230. As an example, the first auxiliary layer 220a may be located between the pixel electrode 210 and the emission layer 220b, and the second auxiliary layer 220c may not be located between the emission layer 220b and the opposite electrode 230. That is, the second auxiliary layer 220c may be omitted.

In an embodiment, the first auxiliary layer 220a may not be located between the pixel electrode 210 and the emission layer 220b, and the second auxiliary layer 220c may be located between the emission layer 220*b* and the opposite electrode 230. That is, the first auxiliary layer 220*a* may be omitted.

In an embodiment, the first auxiliary layer 220*a* may be located between the pixel electrode 210 and the emission layer 220*b*, and the second auxiliary layer 220*c* may be located between the emission layer 220*b* and the opposite electrode 230. Hereinafter, the case where the first auxiliary layer 220*a* and the second auxiliary layer 220*c* are included, is mainly described in detail.

The first auxiliary layer 220*a* may include, for example, a hole transport layer ("HTL") and/or a hole injection layer ("HIL"). The second auxiliary layer 220*c* may include an electron transport layer ("ETL") and/or an electron injection layer ("EIL"). The first auxiliary layer 220*a* and/or the second auxiliary layer 220*c* may be a common layer covering the display substrate entirely.

The opposite electrode 230 may include a conductive material having a low work function. As an example, the opposite electrode 230 may include a (semi) transparent layer including silver (Ag), magnesium (Mg), aluminum (Al), platinum (Pt), palladium (Pd), gold (Au), nickel (Ni), neodymium (Nd), and iridium (Ir), chromium (Cr), lithium (Li), calcium (Ca), or an alloy thereof. Alternatively, the opposite electrode 230 may further include a layer on the (semi) transparent layer, the layer including ITO, IZO, ZnO, or $In_2O_3$. Though not shown, a capping layer may be further disposed on the opposite electrode 230. The capping layer may include lithium fluoride (LiF), an inorganic material, and/or an organic material.

The encapsulation layer 300 may be disposed on the light-emitting element OLED. The encapsulation layer 300 may include a thin-film encapsulation layer or an encapsulation substrate. Hereinafter, the case where the encapsulation layer 300 includes a thin-film encapsulation layer is mainly described in detail.

In an embodiment, the encapsulation layer 300 may include at least one inorganic layer and at least one organic layer. As an example, the thin-film encapsulation layer 300 may include a first inorganic layer 310, an organic layer 320, and a second inorganic layer 330 that are sequentially stacked.

The first inorganic layer 310 may be disposed on the opposite electrode 230. The first inorganic layer 310 may prevent or reduce external moisture or oxygen from penetrating the light-emitting element OLED. The organic layer 320 may be disposed on the first inorganic layer 310. The organic layer 320 may provide a flat surface on the first inorganic layer 310. Because bending or particles formed on the upper surface of the first inorganic layer 310 may be covered by the organic layer 320, it is possible to block the surface state of the upper surface of the first inorganic layer 310, influencing the elements disposed on the organic layer 320. The second inorganic layer 330 may be disposed on the organic layer 320.

The first inorganic layer 310 and the second inorganic layer 330 may include at least one inorganic material from among aluminum oxide, titanium oxide, tantalum oxide, hafnium oxide, zinc oxide, silicon oxide, silicon nitride, and silicon oxynitride. The first and second inorganic layer 310 and 330 may include a single layer or a multi-layer including the above materials. The organic layer 320 may include a polymer-based material. The polymer-based material may include an acryl-based resin, an epoxy-based resin, polyimide, and polyethylene. In an embodiment, the organic layer 320 may include acrylate.

The input sensing layer 400 may be disposed on the encapsulation layer 300. The input sensing layer 400 may include a first sensing insulating layer 410, a first conductive pattern 420, a second sensing insulating layer 430, a second conductive pattern 440, and a third sensing insulating layer 450.

The first sensing insulating layer 410 may be disposed on the encapsulation layer 300. In addition, the first conductive pattern 420 may be disposed on the first sensing insulating layer 410, and covered by the second sensing insulating layer 430. In addition, the second conductive pattern 440 may be disposed on the second sensing insulating layer 430, and covered by the third sensing insulating layer 450. The first sensing insulating layer 410, the second sensing insulating layer 430, and the third sensing insulating layer 450 may each include at least one of an inorganic material and an organic material.

The first conductive pattern 420 and the second conductive pattern 440 may each have conductivity. The first conductive pattern 420 and the second conductive pattern 440 may each be provided as a single layer or a plurality of layers. In addition, at least one of the first conductive pattern 420 and the second conductive pattern 440 may be provided as mesh lines in a plan view. Mesh lines constituting the first conductive pattern 420 and the second conductive pattern 440 may not overlap the emission layer 220*b* in a plan view. Accordingly, even though the input sensing layer 400 is formed on the light-emitting element OLED, light emitted from the emission layer 220*b* of the light-emitting element OLED may be provided to users without being interfered by the input sensing layer 400.

In the case where the light-blocking layer 510 is directly formed on the second conductive pattern 440, at least a portion of the second conductive pattern 440 may be damaged during a process of patterning the light-blocking layer 510. Accordingly, because the third sensing insulating layer 450 is disposed on the second conductive pattern 440, damage to the second conductive pattern 440 may be prevented or reduced.

The filter layer 500 may be disposed on the input sensing layer 400. The filter layer 500 may include the light-blocking layer 510, the color filter layer 520, and the overcoat layer 530. In an embodiment, the color filter layer 520 may be disposed on the input sensing layer 400. The color filter layer 520 may overlap at least a portion of the emission layer 220*b* disposed below the color filter layer 520. The color filter layer 520 may be configured to selectively transmit light corresponding to light provided from the emission layer 220*b*. As an example, in the case where the emission layer 220*b* is configured to provide blue light, the color filter layer 520 may be a blue color filter transmitting blue light. Alternatively, in the case where the emission layer 220*b* is configured to provide green light, the color filter layer 520 may be a green color filter transmitting green light. Alternatively, in the case where the emission layer 220*b* is configured to provide red light, the color filter layer 520 may be a red color filter transmitting red light.

The color filter layer 520 may include polymer photosensitive resin, pigment, or dye. As an example, the color filter layer 520 overlapping the emission layer 220*b* configured to provide blue light may include blue pigment or dye, the color filter layer 520 overlapping the emission layer 220*b* configured to provide green light may include green pigment or dye, and the color filter layer 520 overlapping the emission layer 220*b* configured to provide red light may include red pigment or dye.

However, the embodiment is not limited thereto, and the color filter layer 520 overlapping the emission layer 220b configured to provide blue light may not include pigment or dye. In this case, the color filter layer 520 may be transparent, and may include a transparent photosensitive resin.

The light-blocking layer 510 may be arranged between color filter layers 520 configured to provide different lights. The light-blocking layer 510 is a pattern having a black color and be a matrix having a lattice shape. The light-blocking layer 510 may include a black coloring agent. The black coloring agent may include black dye and black pigment. The black coloring agent may include carbon black, metal such as chrome, or oxides of these. In an embodiment, the light-blocking layer 510 may include the same material as that of the pixel-defining layer 180.

In an embodiment, a second opening 5100P may be defined in the light-blocking layer 510. The second opening 5100P may overlap the first opening 1800P defined in the pixel-defining layer 180. In addition, the second opening 5100P may overlap the emission area EA. In an embodiment, the color filter layer 520 may be disposed inside the second opening 5100P defined in the light-blocking layer 510.

The overcoat layer 530 may be disposed on the light-blocking layer 510 and the color filter layer 520. The overcoat layer 530 is a light-transmissive layer not having colors in a visible light band, and may provide a flat upper surface covering unevenness that occurs in a process of forming the light-blocking layer 510 and the color filter layer 520. As an example, the overcoat layer 530 may include a light-transmissive organic material such as an acryl-based resin.

In an embodiment, the window 600 may be disposed on the filter layer 500. This is described in more detail with reference to FIG. 4.

Figure 4:
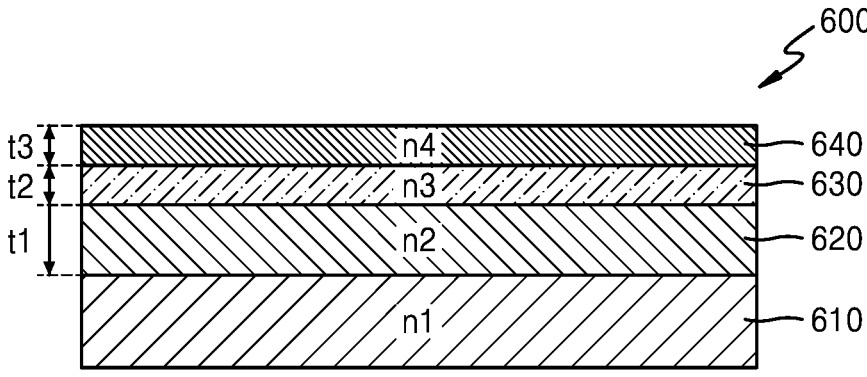
FIG. 4 is a schematic cross-sectional view of a window included in the display apparatus according to an embodiment.

FIG. 4 is a schematic cross-sectional view of a window included in the display apparatus according to an embodiment.

Referring to FIG. 4, the window 600 may include the substrate 610, the low-refractive layer 620, the first functional layer 630, and the second functional layer 640. In this case, the low-refractive layer 620, the first functional layer 630, and the second functional layer 640 may be sequentially stacked on the substrate 610.

In an embodiment, the substrate 610 may include glass. However, the embodiment is not limited thereto. In another embodiment, the substrate 610 may include a polymer resin. A refractive index n1 of the substrate 610 may be about 1.51. Specifically, the refractive index n1 of the substrate 610 with respect to a wavelength of about 550 nanometers (nm) may be about 1.51.

In an embodiment, the low-refractive layer 620 may be disposed on the substrate 610. The low-refractive layer 620 may include a low-refractive material. The low-refractive layer 620 may include metal fluoride. The low-refractive layer 620 may include at least one of magnesium fluoride ($MgF_2$), calcium fluoride ($CaF_2$), aluminum fluoride ($AlF_3$), and ytterbium fluoride ($YbF_3$). As an example, the low-refractive layer 620 may include magnesium fluoride ($MgF_2$). Magnesium fluoride ($MgF_2$) included in the low-refractive layer 620 may have a crystalline structure.

In an embodiment, a refractive index n2 of the low-refractive layer 620 may be about 1.2 to about 1.4. Specifically, the refractive index n2 of the low-refractive layer 620 with respect to a wavelength of about 550 nm may be about 1.38.

In an embodiment, a thickness t1 of the low-refractive layer 620 may be 50 nm to 150 nm. Alternatively, the thickness t1 of the low-refractive layer 620 may be about 60 nm to about 80 nm. Specifically, the thickness t1 of the low-refractive layer 620 may be about 68 nm. In the case where the thickness t1 of the low-refractive layer 620 is too thin (e.g., less than 50 nm), the reflectivity of the window 600 including the low-refractive layer 620 may not be lowered because the reflectivity varies greatly for each wavelength. In addition, in the case where the thickness t1 of the low-refractive layer 620 is too thick (e.g., greater than 150 nm) compared to other layers, the reflectivity of the window 600 including the low-refractive layer 620 may not be lowered.

In the case where refractive layers having different refractive indexes are formed on the substrate 610, a plurality of chambers may be used in a process of manufacturing the window 600. In the window 600 according to an embodiment, because only the low-refractive layer 620 is provided to the substrate 610, the low-refractive layer 620 may be formed on the substrate 610 within one chamber. Accordingly, a process time of the window 600 may be reduced, and thus, productivity of the window 600 may be effectively improved and manufacturing costs of the window 600 may be reduced.

In an embodiment, the low-refractive layer 620 including magnesium fluoride ($MgF_2$) may be formed on the substrate 610 by using an E-beam deposition equipment. As an example, the low-refractive layer 620 may be formed on the substrate 610 inside one chamber by using an E-beam deposition equipment.

In an embodiment, the first functional layer 630 may be disposed on the low-refractive layer 620. The first functional layer 630 may be directly disposed on the low-refractive layer 620.

In an embodiment, the first functional layer 630 may include a low-refractive material. The first functional layer 630 may include oxide. The first functional layer 630 may include at least one inorganic material from among aluminum oxide, titanium oxide, tantalum oxide, hafnium oxide, zinc oxide, silicon oxide, silicon nitride, and silicon oxynitride. As an example, the first functional layer 630 may include silicon oxide ($SiO_2$) and/or aluminum oxide ($Al_2O_3$).

Alternatively, the first functional layer 630 may include silicon-aluminum oxide ($Si_xAl_yO_z$). In this case, x, y, and z may each be a natural number greater than 1. For an example, x, y, and z may be 9, 2, and 10, respectively. That is, the first functional layer 630 may include silicon-aluminum oxide ($Si_9Al_2O_{10}$). However, the embodiment is not limited thereto.

The first functional layer 630 may include silicon oxide in which aluminum atoms are employed. In this case, the first functional layer 630 may be provided as a substitution-type solid solution in which some of silicon atoms of the silicon oxide are replaced by the aluminum atoms. In other words, the first functional layer 630 may include a substitution-type solid solution in which some of silicon atoms of the silicon oxide are replaced by the aluminum atoms. Alternatively, the first functional layer 630 may be provided as a penetration-type solid solution in which the aluminum atoms penetrate a crystal lattice of the silicon oxide. In other words, the first functional layer 630 may include a penetration-type solid solution in which the aluminum atoms penetrate a crystal lattice of the silicon oxide.

Alternatively, the first functional layer 630 may include aluminum oxide in which silicon atoms are employed. In this case, the first functional layer 630 may be provided as a substitution-type solid solution in which some of aluminum atoms of the aluminum oxide are replaced by the silicon atoms. In other words, the first functional layer 630 may include a substitution-type solid solution in which some of aluminum atoms of the aluminum oxide are replaced by the silicon atoms. Alternatively, the first functional layer 630 may be provided as a penetration-type solid solution in which the silicon atoms penetrate a crystal lattice of the aluminum oxide. In other words, the first functional layer 630 may include a penetration-type solid solution in which the silicon atoms penetrate a crystal lattice of the aluminum oxide.

In an embodiment, in the case where the first functional layer 630 is provided as a substitution-type solid solution, a silicon atom, an aluminum atom, and/or an oxygen atom may chemically combine with each other, and exist inside the first functional layer 630. Accordingly, in the case where the first functional layer 630 is provided as a substitution-type solid solution, a coating velocity may be stable (or uniform) while the first functional layer 630 is coated, and the first functional layer 630 of a high density may be formed.

In an embodiment, the first functional layer 630 may include silicon-aluminum oxide ($Si_9Al_2O_{10}$), and silicon-aluminum oxide ($Si_9Al_2O_{10}$) may be provided as a substitution-type solid solution. In this case, silicon-aluminum oxide ($Si_9Al_2O_{10}$) may have a cubic structure in which an oxygen atom, a silicon atom, and an aluminum atom are chemically combined. In addition, the content of aluminum atoms in the first functional layer 630 may be within about 5 percentages (%). As an example, the content of aluminum atoms in silicon-aluminum oxide ($Si_9Al_2O_{10}$) may be within about 5%.

In an embodiment, the first functional layer 630 may be provided as a simple mixture of silicon oxide ($SiO_2$) and aluminum oxide ($Al_2O_3$).

In an embodiment, a refractive index n3 of the first functional layer 630 may be about 1.4 to about 1.6. Specifically, the refractive index n3 of the first functional layer 630 with respect to a wavelength of about 550 nm may be about 1.48.

In an embodiment, a thickness t2 of the first functional layer 630 may be 5 nm to 25 nm. Specifically, the thickness t2 of the first functional layer 630 may be about 15 nm. The window 600 may include the substrate 610, the low-refractive layer 620, the first functional layer 630, and the second functional layer 640. The reflectivity of the window 600 may be reduced by adjusting the materials, the refractive indexes, and the thicknesses of the layers. Accordingly, in the case where the thickness t2 of the first functional layer 630 is less than 5 nm or exceeds 25 nm, a light characteristic changes, and the reflectivity of the window 600 including the first functional layer 630 may not be reduced. Accordingly, in the case where the thickness t2 of the first functional layer 630 satisfies 5 nm to 25 nm, the reflectivity of the window 600 including the first functional layer 630 may be reduced.

In an embodiment, the second functional layer 640 may be disposed on the first functional layer 630. The second functional layer 640 may include a low-refractive material. The second functional layer 640 may include a perfluorinated compound. As an example, the second functional layer 640 may include perfluoropolyether ("PFPE"). However, the embodiment is not limited thereto.

In an embodiment, a refractive index n4 of the second functional layer 640 may be about 1.2 to about 1.4. Specifically, the refractive index n4 of the second functional layer 640 with respect to a wavelength of about 550 nm may be about 1.32.

In an embodiment, a thickness t3 of the second functional layer 640 may be 5 nm to 30 nm. Specifically, the thickness t3 of the second functional layer 640 may be about 25 nm. The second functional layer 640 is included to improve abrasion resistance and/or alcohol resistance of the window 600. In the case where the thickness t3 of the second functional layer 640 is less than 5 nm, the thickness t3 of the second functional layer 640 is too thin, and thus, abrasion resistance and/or alcohol resistance of the second functional layer 640 and/or the window 600 including the second functional layer 640 may be deteriorated. In addition, when the thickness t3 of the second functional layer 640 is less than 5 nm, bonding force (adhesive force, or attaching force) between the second functional layer 640 and the first functional layer 630 is small, and the second functional layer 640 may exfoliate from the first functional layer 630. In contrast, when the thickness t3 of the second functional layer 640 exceeds 30 nm, a thickness t3 of the second functional layer 640 is too thick, the uppermost layer of the second functional layer 640 may exfoliate, and abrasion resistance and/or alcohol resistance of the second functional layer 640 and/or the window 600 including the second functional layer 640 may be deteriorated.

In an embodiment, the low-refractive layer 620 may include magnesium fluoride ($MgF_2$). However, magnesium fluoride ($MgF_2$) has a low bonding force (adhesive force, or adhesion force) with other materials. Accordingly, in the case where the second functional layer 640 is directly disposed on the low-refractive layer 620 including magnesium fluoride ($MgF_2$), bonding force (adhesive force, or adhesion force) between the low-refractive layer 620 and the second functional layer 640 is small, the second functional layer 640 may easily exfoliate from the low-refractive layer 620.

In an embodiment, the window 600 may include the substrate 610, the low-refractive layer 620, the first functional layer 630, and the second functional layer 640. The reflectivity of the window 600 may be reduced through optical interference. By adjusting the thicknesses, refractive indexes, and materials of the substrate 610, the low-refractive layer 620, the first functional layer 630, and the second functional layer 640, lights reflected by the planes between the respective layers, destructively interfere with each other. Accordingly, the reflectivity of the window 600 including the substrate 610, the low-refractive layer 620, the first functional layer 630, and the second functional layer 640, may be reduced. Specifically, two lights from among light reflected by the plane between the substrate 610 and the low-refractive layer 620, light reflected by the plane between the low-refractive layer 620 and the first functional layer 630, light reflected by the plane between the first functional layer 630 and the second functional layer 640, and light reflected by the surface of the second functional layer 640, may destructively interfere with each other, and thus, the reflectively of the window 600 may be reduced.

In an embodiment, the first functional layer 630 may be disposed between the low-refractive layer 620 and the second functional layer 640. The first functional layer 630 may improve bonding force (adhesive force or attaching force) between the low-refractive layer 620 and the second functional layer 640. That is, because the first functional layer 630 is disposed between the low-refractive layer 620 and the second functional layer 640, adhesion between the low-refractive layer 620 and the second functional layer 640, is improved, and thus, exfoliation of the second functional layer from the low-refractive layer 620 may be prevented or reduced.

In an embodiment, a sum of the thicknesses of elements disposed on the substrate 610 may be about 60 nm to about 205 nm. Specifically, a sum (t1+t2+t3) of the thickness t1 of the low-refractive layer 620, the thickness t2 of the first functional layer 630, and the thickness t3 of the second functional layer 640 disposed on the substrate 610, may be about 60 nm to about 205 nm. Alternatively, a sum (t1+t2+ t3) of the thickness t1 of the low-refractive layer 620, the thickness t2 of the first functional layer 630, and the thickness t3 of the second functional layer 640 disposed on the substrate 610, may be about 70 nm to about 135 nm.

TABLE 1

| | Reflectivity (%) | Reflection color sense | |
| | | a* | b* |
| Embodiment 1 | 5.85 | −0.06 | −0.32 |
| Comparative Example | 5.97 | 0.27 | −2.25 |

Table 1 is a table representing reflectivity of a window and reflection color sense evaluation results according to Embodiment 1 and Comparative Example. In Table 1, Embodiment 1 corresponds to the case where the window 600 includes the substrate 610, a low-refractive layer 620, the first functional layer 630, and the second functional layer 640. The substrate 610, a low-refractive layer 620, the first functional layer 630, and the second functional layer 640 include glass, magnesium fluoride ($MgF_2$), silicon-aluminum oxide ($Si_9Al_2O_{10}$), and perfluoropolyether (PFPE), respectively. In this case, silicon-aluminum oxide ($Si_9Al_2O_{10}$) may include a substitution-type solid solution. In addition, Comparative Example corresponds to the case where the window 600 includes the substrate 610, a low-refractive layer 620, the first functional layer 630, and the second functional layer 640. The substrate 610, a low-refractive layer 620, the first functional layer 630, and the second functional layer 640 include glass, magnesium fluoride ($MgF_2$), silicon oxide ($SiO_2$), and perfluoropolyether (PFPE), respectively. That is, Embodiment 1 is different from Comparative Example in that the first functional layer 630 includes silicon-aluminum oxide ($Si_9Al_2O_{10}$) having a substitution-type solid solution structure, and the comparative example includes silicon oxide ($SiO_2$). In addition, the elements of Embodiment 1 and Comparative Example may be provided in the refractive indexes and thicknesses described above with reference to FIG. 4.

In Table 1, reflectivity means the reflectivity measured in a SCI specular component included (SCI) mode, and a* and b* represent a* and b* in the L*a*b* color system of light measured in a specular component excluded (SCE) mode, respectively. When the reflectivity of the window 600 is 6.3% or less, it corresponds to the case that satisfies required conditions. In addition, because a* of the display panel 10 satisfies −2<a*<2, it may be preferable that a* of the window 600 has an equivalent level of an a* value. Accordingly, when a* of the window 600 has a value in −2<a*<2, it corresponds to the case (SPEC IN) that satisfies a required condition. In addition, when a* of the window 600 has a value deviating from the above range, it corresponds to the case (SPEC OUT) that does not satisfy the required condition. In addition, because b* of the display panel 10 satisfies −1.5<b*<0.5, it may be preferable that b* of the window 600 also has an equivalent level of an b* value. Accordingly, when b* of the window 600 has a value in −1.5<b*<0.5, it corresponds to the case (SPEC IN) that satisfies a required condition. In addition, when b* of the window 600 has a value deviating from the above range, it corresponds to the case (SPEC OUT) that does not satisfy the required condition.

Referring to Table 1, both Embodiment 1 and Comparative Example have the reflectivity of 6.3% or less, it may be determined that both Embodiment 1 and Comparative Example have the reflectivity of the required condition. In addition, the reflectivity of Embodiment 1 is about 5.85%, and the reflectivity of Comparative Example is about 5.97%, it may be determined that the reflectivity of Embodiment 1 is less than the reflectivity of Comparative example.

a* and b* of Embodiment 1 are 0.06 and −0.32, respectively, and it may be determined that a* and b* of Embodiment 1 satisfy required conditions, respectively. In contrast, a* and b* of Comparative Example are 0.27 and −2.25, respectively, and it may be determined that b* of Comparative Example does not satisfy the required condition. That is, it may be determined that both a* and b* of Embodiment 1 satisfy required reflection color sense, but b* of Comparative Example does not satisfy a required reflection sense.

Accordingly, it may be determined that the case where the first functional layer 630 includes silicon-aluminum oxide ($Si_9Al_2O_{10}$) having a substitution-type solid solution structure, has a lower reflectivity and a reflection color sense of the required condition compared to the case where the first functional layer 630 includes silicon oxide ($SiO_2$).

Figure 5:
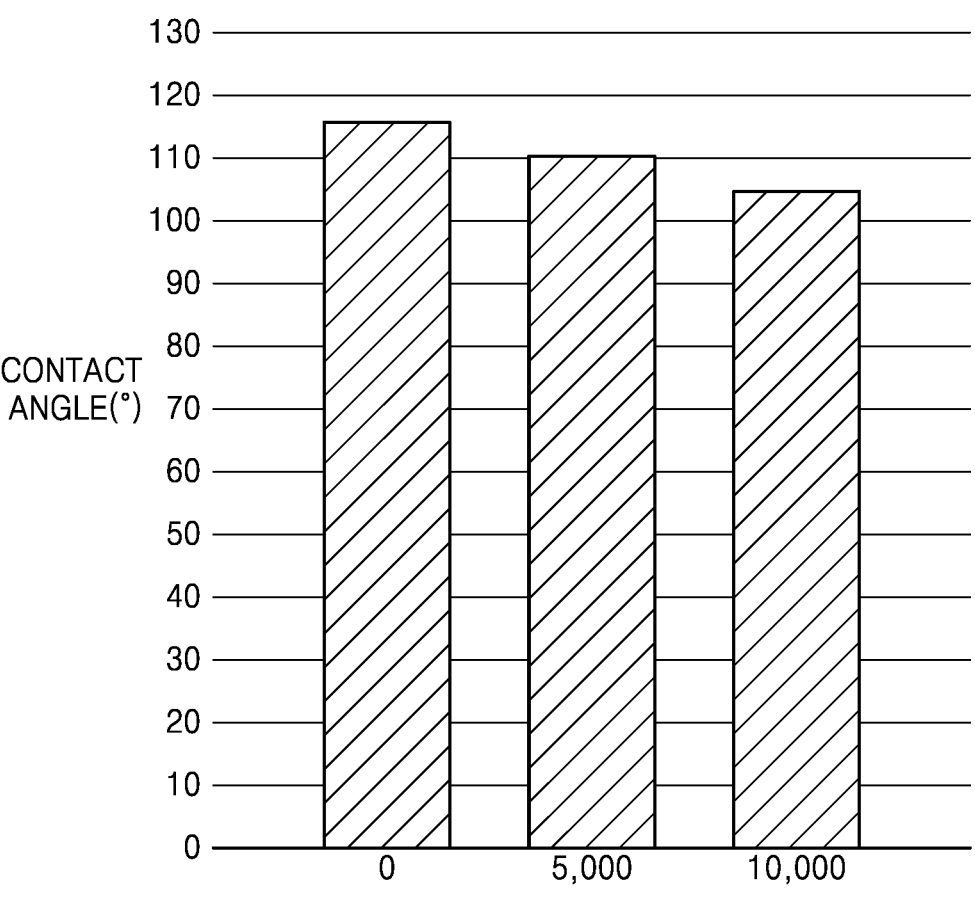
FIG. 5 is a graph showing abrasion resistance evaluation results of Embodiment 1.

FIG. 5 is a graph showing abrasion resistance evaluation results of Embodiment 1. FIG. 5 is a graph showing results of measuring a contact angle with respect to water of the surface of the window 600 of Embodiment 1 before and after an abrasion resistance evaluation is performed. In FIG. 5, in Table 1, the abrasion resistance evaluation was performed in which: after applying a load of about 1 Kg to the surface of the window 600 of Embodiment 1, having the above structure using an eraser, and reciprocating a distance of about 15 mm at a speed of about 40 cycles/min 5000 times and 10,000 times, a contact angle was measured. In this case, the amount of protrusion of the eraser was 5 mm from the end of a jig.

The surface of the window 600 that is antifouling-treated has hydrophobicity. In the case where the surface of the window 600 has hydrophobicity, a contact angle with respect to water may increase. However, the surface of the window 600 may be hydrophilized by external repeated stress and/or strong impact. In the case where the surface of the window 600 is hydrophilized, a contact angle with respect to water may be reduced. In this case, after abrasion resistance evaluation, when a contact angle with respect to water is 95° or more, it may denote that the surface of the window 600 withstands external stress and impact well. When a contact angle with respect to water is less than 95°, it may denote that the surface of the window 600 does not withstand external stress and impact well. Accordingly, when a contact angle of the surface of the window 600 with respect to water after 6,000 times of the abrasion resistance evaluation is 95° or more, it corresponds to the case (SPEC IN) where the window 600 satisfies a required abrasion resistance. When a contact angle of the surface of the window 600 with respect to water after performing 6,000 times is less than 95°, it corresponds to the case (SPEC OUT) where the window 600 does not satisfy the required abrasion resistance.

Referring to FIG. 5, it may be determined that contact angles of the surface of the window 600 with respect to water before, after 5,000 times, and after 10,000 times of the abrasion resistance evaluation using the eraser are 115.7°, 110.3°, and 104.7°, respectively. Accordingly, because a contact angle of the surface of the window 600 with respect to water after 10,000 times of the abrasion resistance evaluation is 95° or more, it may be determined that Embodiment 1 has the abrasion resistance of the required condition.

Figure 6:
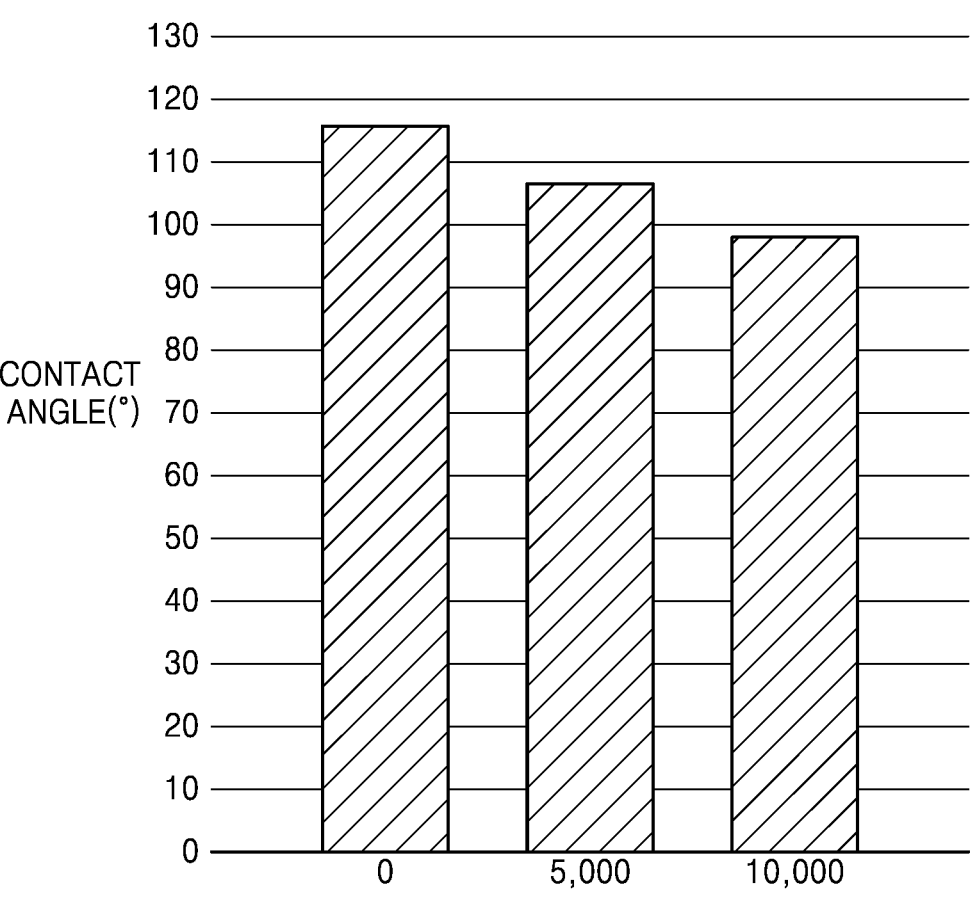
FIG. 6 is a graph showing abrasion resistance evaluation results of Embodiment 1.

FIG. 6 is a graph showing abrasion resistance evaluation results of Embodiment 1. FIG. 6 is a graph showing results of measuring a contact angle with respect to water of the surface of the window 600 of Embodiment 1 before and after an abrasion resistance evaluation is performed. In FIG. 6, in Table 1, the abrasion resistance evaluation was performed in which: after applying a load of about 1 Kg to the surface of the window 600 of Embodiment 1, having the above structure using a steel-wool, and reciprocating a distance of about 15 mm at a speed of about 40 cycles/min 5000 times and 10,000 times, a contact angle was measured.

As described above with reference to FIG. 5, in the abrasion resistance evaluation using the steel-wool, when a contact angle of the surface of the window 600 with respect to water after 5,000 times of the abrasion resistance evaluation is 95° or more, it corresponds to the case (SPEC IN) where the window 600 satisfies a required abrasion resistance. When a contact angle of the surface of the window 600 with respect to water after 5,000 times of the abrasion resistance evaluation is less than 95°, it corresponds to the case (SPEC OUT) where the window 600 does not satisfy the required abrasion resistance.

Referring to FIG. 6, it may be determined that contact angles of the surface of the window 600 with respect to water before, after 5,000 times, and after 10,000 times of the abrasion resistance evaluation using the steel-wool are 115.7°, 106.5°, and 98°, respectively. Accordingly, because a contact angle of the surface of the window 600 with respect to water after 10,000 times of the abrasion resistance evaluation is 95° or more, it may be determined that Embodiment 1 has the abrasion resistance of the required condition. In addition, because a contact angle of the surface of the window 600 with respect to water after 5,000 times of the abrasion resistance evaluation is about 106.5°, it may be determined that a contact angle of the surface of the window 600 with respect to water is 100° or more even in the case where the abrasion resistance evaluation is performed 5,000 times.

Figure 7:
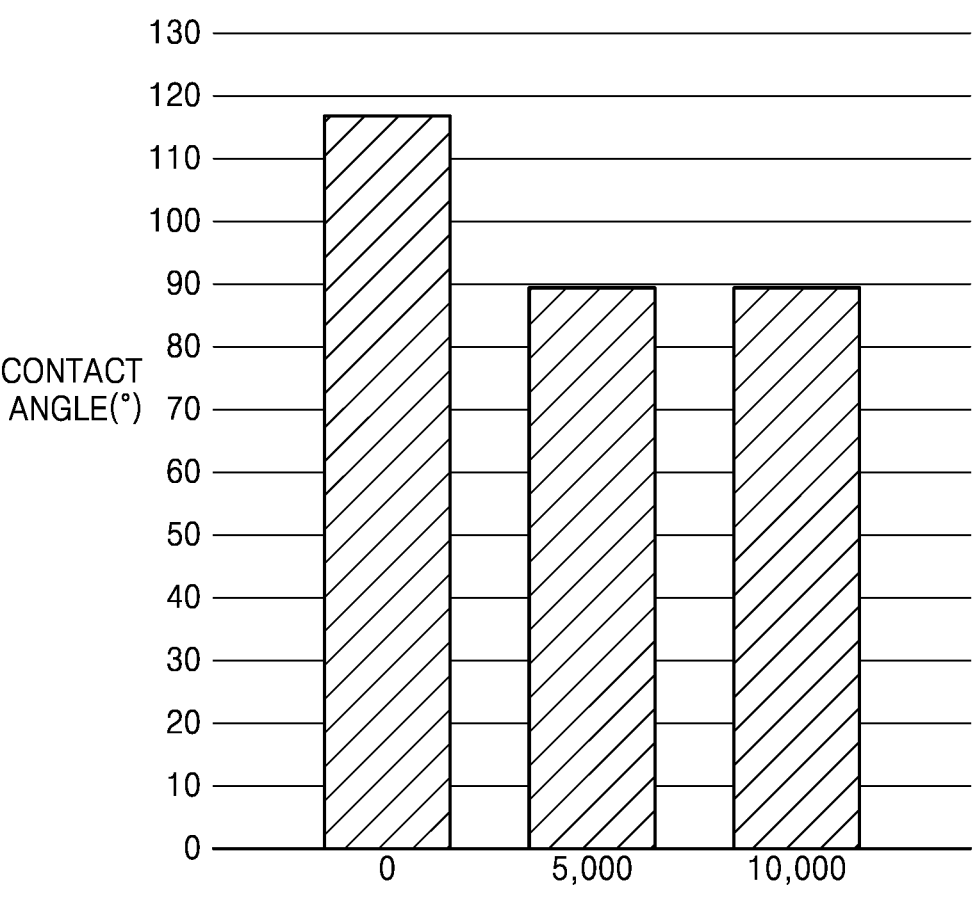
FIG. 7 is a graph showing abrasion resistance evaluation results of Comparative Example.

FIG. 7 is a graph showing abrasion resistance evaluation results of Comparative Example. FIG. 7 is a graph showing results of measuring a contact angle with respect to water of the surface of the window 600 of Comparative Example before and after an abrasion resistance evaluation is performed. In FIG. 7, in Table 1, the abrasion resistance evaluation was performed in which: after applying a load of about 1 Kg to the surface of the window 600 of Comparative Example, having the above structure using an eraser, and reciprocating a distance of about 20 mm at a speed of about 40 cycles/min 5000 times and 10,000 times, a contact angle was measured. In this case, the amount of protrusion of the eraser was 5 mm from the end of a jig.

As described above with reference to FIG. 5, in the abrasion resistance evaluation using the eraser, when a contact angle of the surface of the window 600 with respect to water after 6,000 times of the abrasion resistance evaluation is 95° or more, it corresponds to the case (SPEC IN) where the window 600 satisfies a required abrasion resistance. When a contact angle of the surface of the window

600 with respect to water after 6,000 times of the abrasion resistance evaluation is less than 95°, it corresponds to the case (SPEC OUT) where the window 600 does not satisfy the required abrasion resistance.

Referring to FIG. 7, it may be determined that contact angles of the surface of the window 600 with respect to water before, after 5,000 times, and after 10,000 times of the abrasion resistance evaluation using the eraser are 116.8°, 89.4°, and 89.4°, respectively. Accordingly, because a contact angle of the surface of the window 600 with respect to water after 10,000 times of the abrasion resistance evaluation is less than 95°, it may be determined that Comparative Example does not have the abrasion resistance of the required condition.

Figure 8:
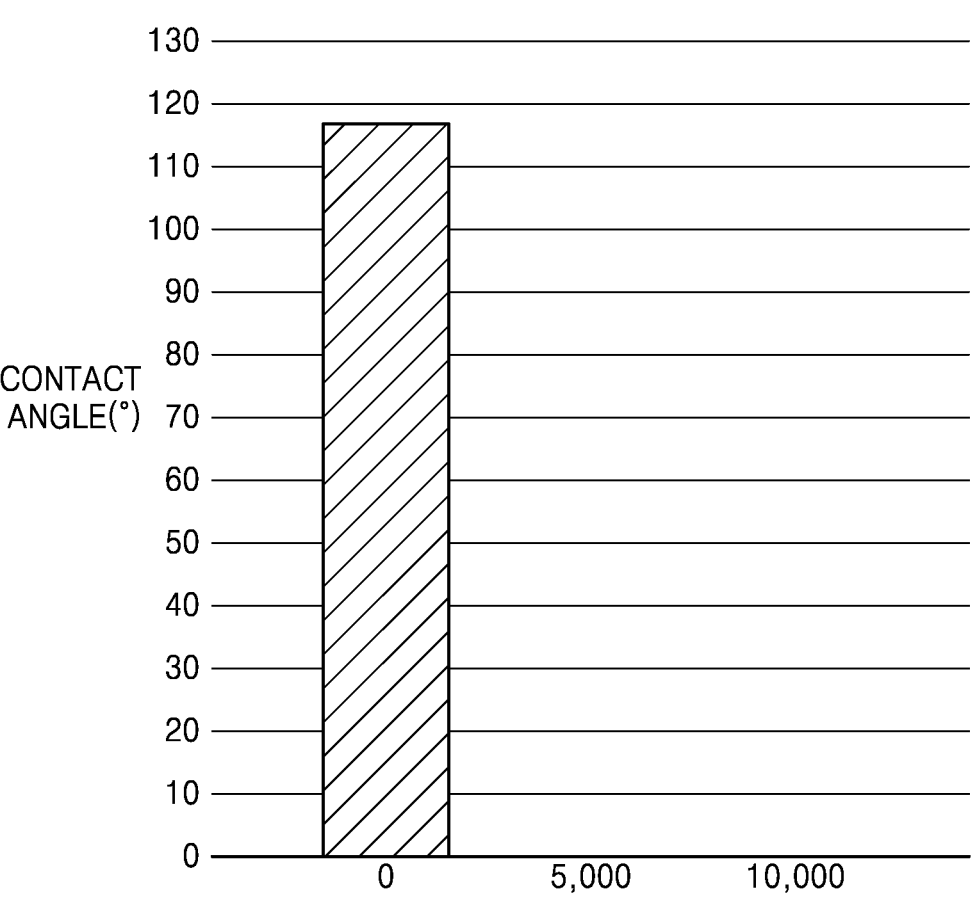
FIG. 8 is a graph showing abrasion resistance evaluation results of Comparative Example.

FIG. 8 is a graph showing abrasion resistance evaluation results of Comparative Example. FIG. 8 is a graph showing results of measuring a contact angle with respect to water of the surface of the window 600 of Comparative Example before and after an abrasion resistance evaluation is performed. In FIG. 8, in Table 1, the abrasion resistance evaluation was performed in which: after applying a load of about 1 Kg to the surface of the window 600 of Comparative Example, having the above structure using a steel-wool, and reciprocating a distance of about 20 mm at a speed of about 40 cycles/min 5000 times and 10,000 times, a contact angle was measured.

As described above with reference to FIG. 5, in the abrasion resistance evaluation using the steel-wool, when a contact angle of the surface of the window 600 with respect to water after 5,000 times of the abrasion resistance evaluation is 95° or more, it corresponds to the case (SPEC IN) where the window 600 satisfies a required abrasion resistance. When a contact angle of the surface of the window 600 with respect to water after 5,000 times of the abrasion resistance evaluation is less than 95°, it corresponds to the case (SPEC OUT) where the window 600 does not satisfy the required abrasion resistance.

Referring to FIG. 8, though a contact angle of the surface of the window 600 with respect to water before the abrasion resistance evaluation is performed, is 116.8°, a contact angle of the surface of the window 600 with respect to water in the case where the abrasion resistance evaluation is performed by using steel-wool was not measured. Accordingly, because a contact angle of the surface of the window 600 with respect to water after 10,000 times of the abrasion resistance evaluation is less than 95°, it may be determined that Comparative Example does not have the abrasion resistance of the required condition.

Accordingly, it may be determined that the case where the first functional layer 630 includes silicon-aluminum oxide ($Si_9Al_2O_{10}$) having a substitution-type solid solution structure, has a higher level of abrasion resistance compared to the case where the first functional layer 630 includes silicon oxide ($SiO_2$).

Figure 9:
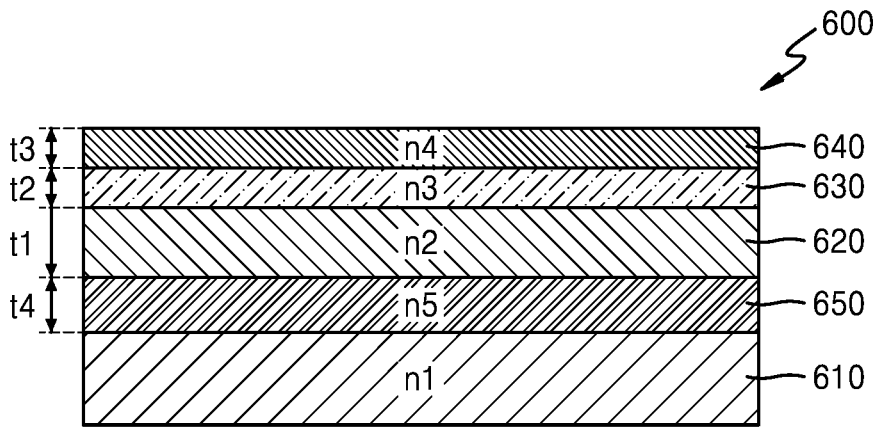
FIG. 9 is a schematic cross-sectional view of a window included in the display apparatus according to an embodiment.

FIG. 9 is a schematic cross-sectional view of a window included in the display apparatus according to an embodiment. Specifically, the embodiment of FIG. 9 is different from the embodiment of FIG. 4 in that the window 600 further includes a third functional layer 650. In FIG. 9, the same reference numerals as those of FIG. 4 denote the same members, and thus, repeated descriptions thereof are omitted.

Referring to FIG. 9, the window 600 may include the substrate 610, the low-refractive layer 620, the first functional layer 630, the second functional layer 640, and the third functional layer 650.

In an embodiment, the third functional layer 650 may be disposed on the substrate 610, and the low-refractive layer 620 may be disposed on the third functional layer 650. That is, the third functional layer 650 may be disposed between the substrate 610 and the low-refractive layer 620.

In an embodiment, the third functional layer 650 may include an intermediate refractive material. The third functional layer 650 may include oxide. The third functional layer 650 may include one of yttrium oxide ($Y_2O_3$), magnesium oxide (MgO), and aluminum oxide ($Al_2O_3$). As an example, the third functional layer 650 may include yttrium oxide ($Y_2O_3$).

In an embodiment, a refractive index n5 of the third functional layer 650 may be about 1.6 to about 1.8. Specifically, the refractive index n5 of the third functional layer 650 with respect to a wavelength of about 550 nm may be about 1.66.

Because the third functional layer 650 having the refractive index n5 of about 1.6 to about 1.8 is disposed under the low-refractive layer 620 having the refractive index n2 of about 1.2 to about 1.4, the reflectivity of the window 600 including the low-refractive layer 620 and the third functional layer 650 may be even more reduced through optical interference. Specifically, because the third functional layer 650 having the refractive index (e.g., an intermediate refractive index) of about 1.66 is disposed under the low-refractive layer 620 having the refractive index (e.g., a low refractive index) of about 1.38, at least two lights from among light reflected by a plane (i.e., border surface) between the first functional layer 630 and the low-refractive layer 620, light reflected by a plane (i.e., border surface) between the low-refractive layer 620 and the third functional layer 650, and light reflected by a plane (i.e., border surface) between the third functional layer 650 and the substrate 610 destructively interfere with each other, and thus, the reflectivity of the window 600 may be even more reduced.

In an embodiment, a thickness t4 of the third functional layer 650 may be 5 nm to 30 nm. The window 600 may include the substrate 610, the third functional layer 650, the low-refractive layer 620, the first functional layer 630, and the second functional layer 640. The reflectivity of the window 600 may be reduced by adjusting the materials, the refractive indexes, and the thicknesses of the layers. In the case where the thickness t4 of the third functional layer 650 is less than 5 nm or exceeds 30 nm, a light characteristic changes, and the reflectivity of the window 600 including the third functional layer 650 may not be reduced. Accordingly, in the case where the thickness t4 of the third functional layer 650 satisfies 5 nm to 30 nm, the reflectivity of the window 600 including the third functional layer 650 may be effectively reduced.

As described above, the low-refractive layer 620 including magnesium fluoride ($MgF_2$) may be formed on the substrate 610 by using E-beam deposition equipment (See FIG. 4). In the case where the low-refractive layer 620 is formed on the substrate 610 at temperature of about 200 degrees in Celsius (° C.) to about 300° C., bonding force (adhesive force or attaching force) between the substrate 610 and the low-refractive layer 620 may be high. That is, as a layer-forming temperature of the low-refractive layer 620 increases, the bonding force (adhesive force, attaching force) between the substrate 610 and the low-refractive layer 620 may increase. In the case where the low-refractive layer 620 is formed on the substrate 610 at temperature of about 200° C. to about 300° C., one cycle for forming the low-refractive layer 620 on the substrate 610 may take about 90 minutes. That is, in the case where a layer-forming temperature of the low-refractive layer 620 is high, a process time required for forming a layer of the low-refractive layer 620 may increase.

In addition, in the case where the low-refractive layer 620 is formed on the substrate 610 at temperature of about 50° C. to about 200° C., bonding force (adhesive force or attaching force) between the substrate 610 and the low-refractive layer 620 may be low. That is, in the case where the low-refractive layer 620 is formed at low temperature, the bonding force (adhesive force, attaching force) between the substrate 610 and the low-refractive layer 620 may low. However, in the case where the low-refractive layer 620 is formed on the substrate 610 at temperature of about 50° C. to about 200° C., one cycle may take about 60 minutes. That is, in the case where a layer-forming temperature of the low-refractive layer 620 is low, a process time required for forming a layer of the low-refractive layer 620 may be reduced.

In an embodiment, the third functional layer 650 may be disposed between the substrate 610 and the low-refractive layer 620. The third functional layer 650 may improve bonding force (adhesive force or attaching force) between the substrate 610 and the low-refractive layer 620. That is, because the third functional layer 650 is disposed between the substrate 610 and the low-refractive layer 620, adhesion between the substrate 610 and the low-refractive layer 620 improves, and thus, exfoliation of the low-refractive layer 620 from the substrate 610 may be effectively prevented or reduced.

In an embodiment, because the third functional layer 650 is disposed between the substrate 610 and the low-refractive layer 620, the low-refractive layer 620 may be formed at temperature of about 50° C. to about 200° C. That is, because the third functional layer 650 is disposed between the substrate 610 and the low-refractive layer 620, the low-refractive layer 620 including magnesium fluoride ($MgF_2$) may be formed at temperature of about 50° C. to about 200° C. In this case, in the case where a layer-forming temperature of the low-refractive layer 620 is less than 50° C., the layer-forming temperature of the low-refractive layer 620 is too low and attaching force of the low-refractive layer 620 may be too low. Accordingly, the low-refractive layer 620 may exfoliate from the third functional layer 650. In addition, in the case where the layer-forming temperature of the low-refractive layer 620 exceeds 200° C., the layer-forming temperature of the low-refractive layer 620 is two high and a process time may increase. Accordingly, when the layer of the low-refractive layer 620 is formed at temperature of about 50° C. to about 200° C., the low-refractive layer 620 may have an appropriate level of attaching force, and simultaneously, a process time may be reduced.

In an embodiment, in the case where magnesium fluoride ($MgF_2$) is formed as a layer at temperature of about 50° C. to about 200° C., the formed layer of magnesium fluoride ($MgF_2$) may have an amorphous or partially crystalline structure.

TABLE 2

|  |  | Reflection color sense | |
| --- | --- | --- | --- |
|  | Reflectivity (%) | a* | b* |
| Embodiment 2 | 6.03 | −0.02 | −0.36 |

Table 2 is a table representing reflectivity of a window and reflection color sense evaluation results according to Embodiment 2. In Table 2, Embodiment 2 corresponds to the case where the window 600 includes the substrate 610, the third functional layer 650, the low-refractive layer 620, the first functional layer 630, and the second functional layer 640. The substrate 610, the third functional layer 650, the low-refractive layer 620, the first functional layer 630, and the second functional layer 640 include glass, yttrium oxide ($Y_2O_3$), magnesium fluoride ($MgF_2$), silicon-aluminum oxide ($Si_9Al_2O_{10}$), and perfluoropolyether (PFPE), respectively. In this case, silicon-aluminum oxide ($Si_9Al_2O_{10}$) may include a substitution-type solid solution. In addition, the elements of Embodiment 2 may be provided in the refractive indexes and thicknesses described above with reference to FIGS. 4 and 9.

As described in Table 1, in the case where the reflectivity of the window 600 is 6.3% or less, it corresponds to the case that satisfies a required condition. In addition, a* of the window 600 has a value in −2<a*<2, it corresponds to the case (SPEC IN) that satisfies the required condition, and b* of the window 600 has a value in −1.5<b*<0.5, it corresponds to the case (SPEC IN) that satisfies the required condition.

Referring to Table 2, because Embodiment 2 has reflectivity of 6.3% or less, it may be determined that Embodiment 2 has reflectivity of the required condition. a* and b* of Embodiment 2 are −0.02 and −0.36, respectively. It is determined that a* and b* of Embodiment 2 satisfy the required conditions, respectively.

Accordingly, in the case where the window 600 has the structure of Embodiment 2, it may be determined that the window 600 has reflectivity and reflection color sense of the required conditions.

Figure 10:
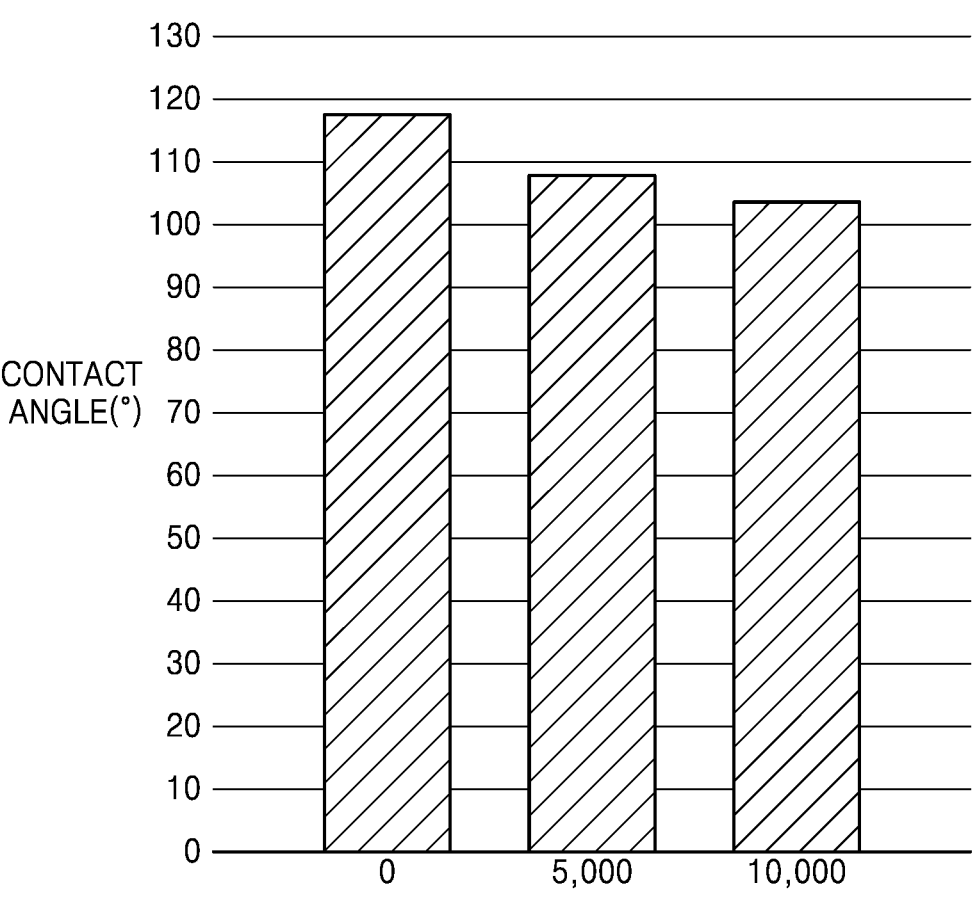
FIG. 10 is a graph showing abrasion resistance evaluation results of Embodiment 2.

FIG. 10 is a graph showing abrasion resistance evaluation results of Embodiment 2. FIG. 10 is a graph showing results of measuring a contact angle with respect to water of the surface of the window 600 of Embodiment 2 before and after an abrasion resistance evaluation is performed. An abrasion resistance evaluation was performed on the surface of the window 600 of Embodiment 2 having the above structure in Table 2 under the same conditions as those in FIG. 5.

Referring to FIG. 10, it may be determined that contact angles of the surface of the window 600 with respect to water before, after 5,000 times, and after 10,000 times of the abrasion resistance evaluation using the eraser are 117.5°, 107.8°, and 103.6°, respectively. Accordingly, because a contact angle of the surface of the window 600 with respect to water after 10,000 times of the abrasion resistance evaluation is 95° or more, it may be determined that Embodiment 2 has the abrasion resistance of the required condition.

Figure 11:
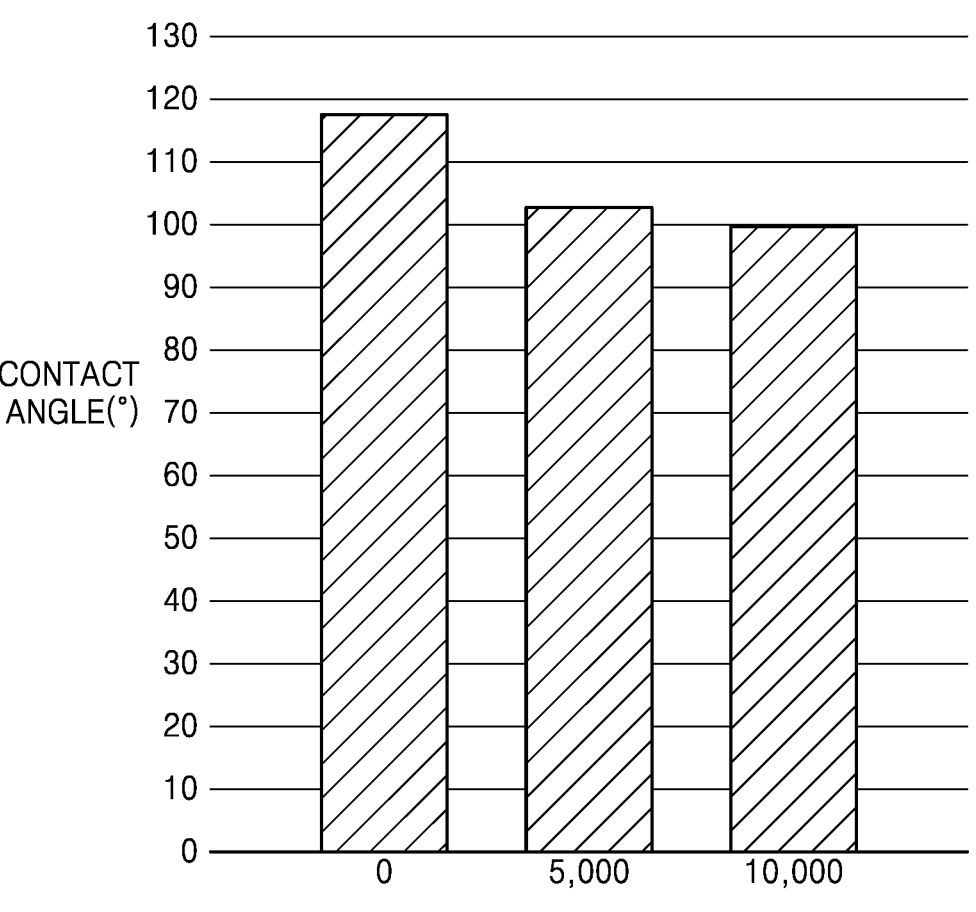
FIG. 11 is a graph showing abrasion resistance evaluation results of Embodiment 2.

FIG. 11 is a graph showing abrasion resistance evaluation results of Embodiment 2. FIG. 11 is a graph showing results of measuring a contact angle with respect to water of the surface of the window 600 of Embodiment 2 before and after an abrasion resistance evaluation is performed. An abrasion resistance evaluation was performed on the surface of the window 600 of Embodiment 2 having the above structure in Table 2 under the same conditions as those in FIG. 6.

Referring to FIG. 11, it may be determined that contact angles of the surface of the window 600 with respect to water before, after 5,000 times, and after 10,000 times of the abrasion resistance evaluation using the steel-wool are 117.5°, 102.7°, and 99.7°, respectively. Accordingly, because a contact angle of the surface of the window 600 with respect to water after 10,000 times of the abrasion resistance evaluation is 95° or more, it may be determined that Embodiment 2 has the abrasion resistance of the required condition.

As described above with reference to FIG. 4, the window 600 may include the substrate 610, the low-refractive layer 620, the first functional layer 630, and the second functional layer 640. In this case, the low-refractive layer 620, the first functional layer 630, and the second functional layer 640 may be sequentially stacked on the substrate 610. In addition, the substrate 610, the low-refractive layer 620, the first functional layer 630, and the second functional layer 640 may include glass, magnesium fluoride ($MgF_2$), silicon-aluminum oxide ($Si_9Al_2O_{10}$), and perfluoropolyether (PFPE), respectively.

As described above, when the layer-forming temperature of the low-refractive layer 620 including magnesium fluoride ($MgF_2$) is high, bonding force (adhesive force or attaching force) between the substrate 610 and the low-refractive layer 620 may increase. However, in the case where the layer-forming temperature of the low-refractive layer 620 is high, a process time required for forming the layer of the low-refractive layer 620 may increase. In addition, in the case where the low-refractive layer 620 is formed at low temperature, the bonding force (adhesive force, attaching force) between the substrate 610 and the low-refractive layer 620 may low.

In an embodiment, a layer of the low-refractive layer 620 including magnesium fluoride ($MgF_2$) may be formed at low temperature by using ion-assisted deposition ("IAD"). In the case where IAD is used, while deposition particles of low-refractive materials are attached to the substrate 610, ionized argons, oxygens or the like may collide together, increase kinetic energy of the deposition particles, and increase bonding force (adhesive force or attaching force) of a deposited layer.

In this case, a layer of the low-refractive layer 620 including magnesium fluoride ($MgF_2$) may be formed on the substrate 610 by using reactive gases and inert gases (dynamical mixing type). The reactive gases may include oxygen, nitrogen, and the like, and the inert gases may include argon (Ar), helium (He), and the like. As an example, an inactive gas may be used as the inert gas. The reactive gases and inert gases may activate the surface of the low-refractive layer 620, accelerate surface oxidation of the low-refractive layer 620, or help chemical stabilization of the low-refractive layer 620 without influencing the inner crystalline structure of the low-refractive layer 620.

In an embodiment, the reactive gases may include oxygen (or oxygen ions), and the inert gases may include argon (or argon ions). In this case, flux of oxygen (or oxygen ions) may be about 5 standard cubic centimeters per minute (sccm) to about 30 sccm, and flux of argon (or argon ions) may be about 30 sccm to about 5 sccm. The low-refractive layer 620 formed by the IAD may be formed in an amorphous and crystalline mixture. In addition, magnesium oxide (MgO) and/or argon atoms may exist in a portion of the low-refractive layer 620. Accordingly, because magnesium oxide (MgO) and/or argon atoms fill a space inside the low-refractive layer 620, the density of the low-refractive layer 620 may increase, and absorption of water molecules into the low-refractive layer 620 may be prevented or reduced.

In an embodiment, the reactive gases may include nitrogen (or nitrogen ions), and the inert gases may include argon (or argon ions). In this case, flux of nitrogen (or nitrogen ions) may be about 5 sccm to about 30 sccm, and flux of argon (or argon ions) may be about 30 sccm to about 5 sccm. The low-refractive layer 620 formed by the IAD may be formed in an amorphous and crystalline mixture. In addition, nitrogen atoms and/or argon atoms may exist in a portion of the low-refractive layer 620. Accordingly, because nitrogen atoms and/or argon atoms fill a space inside the low-refractive layer 620, the density of the low-refractive layer 620 may increase, and absorption of water molecules into the low-refractive layer 620 may be prevented or reduced.

In an embodiment, the reactive gases may include oxygen (or oxygen ions), and the inert gases may include helium (or helium ions). In this case, flux of oxygen (or oxygen ions) may be about 5 sccm to about 30 sccm, and flux of helium (or helium ions) may be about 30 sccm to about 5 sccm. The low-refractive layer 620 formed by the IAD may be formed in an amorphous and crystalline mixture. In addition, magnesium oxide (MgO) and/or helium atoms may exist in a portion of the low-refractive layer 620. Accordingly, because magnesium oxide (MgO) and/or helium atoms fill a space inside the low-refractive layer 620, the density of the low-refractive layer 620 may increase, and absorption of water molecules into the low-refractive layer 620 may be prevented or reduced.

In an embodiment, a layer of the low-refractive layer 620 including magnesium fluoride ($MgF_2$) may be formed at temperature of about 50° C. to about 200° C. by using IAD. Accordingly, a process time required for forming a layer of the low-refractive layer 620 on the substrate 610 may be reduced.

In an embodiment, because the low-refractive layer 620 including magnesium fluoride ($MgF_2$) may be formed on the substrate 610 by using IAD, bonding force (adhesive force or attaching force) between the substrate 610 and the low-refractive layer 620 may be improved even without forming a separate layer between the substrate 610 and the low-refractive layer 620. In addition, because the low-refractive layer 620 including magnesium fluoride ($MgF_2$) may be formed on the substrate 610 by using IAD, the low-refractive layer 620 may be formed at low temperature (e.g., temperature of about 50° C. to about 200° C.). Accordingly, a process time taken for manufacturing the window 600 may be reduced.

According to an embodiment, the visibility of the display apparatus may be prevented or reduced from being deteriorated by external light reflection. In addition, bonding force between the layers included in the window may be improved, and thus, an abrasion resistance characteristic of the window may be improved. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A window comprising:
a substrate;
a low-refractive layer disposed on the substrate and including a metal fluoride;
a first functional layer disposed on the low-refractive layer, having a thickness of 5 nm to 25 nm, and including an oxide; and
a second functional layer disposed on the first functional layer and including perfluorinated compound.

2. The window of claim 1, wherein the low-refractive layer includes magnesium fluoride.

3. The window of claim 1, wherein the low-refractive layer has a refractive index of about 1.2 to about 1.4.

4. The window of claim 1, wherein the low-refractive layer has a thickness of 50 nanometers (nm) to 150 nm.

5. The window of claim 1, wherein the low-refractive layer has a crystalline structure.

6. The window of claim 1, wherein the first functional layer includes a silicon-aluminum oxide.

7. The window of claim 1, wherein the first functional layer includes a silicon oxide in which aluminum atoms are employed.

8. The window of claim 7, wherein the first functional layer includes a substitution-type solid solution in which some of silicon atoms of the silicon oxide are replaced by the aluminum atoms.

9. The window of claim 7, wherein the first functional layer includes a penetration-type solid solution in which the aluminum atoms penetrate a crystalline lattice of the silicon oxide.

10. The window of claim 1, wherein the first functional layer includes an aluminum oxide in which silicon atoms are employed.

11. The window of claim 10, wherein the first functional layer includes a substitution-type solid solution in which some of aluminum atoms of the aluminum oxide are replaced by the silicon atoms.

12. The window of claim 1, wherein the first functional layer has a refractive index of about 1.4 to about 1.6.

13. The window of claim 1, wherein the second functional layer has a thickness of 5 nm to 30 nm.

14. The window of claim 1, further comprising a third functional layer disposed between the substrate and the low-refractive layer and including an oxide.

15. The window of claim 14, wherein the third functional layer includes one of yttrium oxide, magnesium oxide, and aluminum oxide.

16. The window of claim 14, wherein a refractive index of the third functional layer is greater than a refractive index of the low-refractive layer.

17. The window of claim 16, wherein the third functional layer has a refractive index of about 1.6 to about 1.8.

18. The window of claim 14, wherein the third functional layer has a thickness of 5 nm to 30 nm.

19. The window of claim 1, wherein, after applying a load of 1 Kg to a surface of the window using an eraser, and reciprocating a distance of 15 millimeters (mm) at a speed of 40 cycles per minute (cycles/min) 6000 times, a contact angle of the surface of the window with respect to water is 95 degrees)(° or more.

20. A display apparatus comprising:
a display panel; and
a window disposed on the display panel,
wherein the display panel includes:
a display substrate;
a light-emitting element disposed over the display substrate; and
a filter layer disposed on the light-emitting element and including a color filter layer and a light-blocking layer, and
wherein the window includes:
a substrate;
a low-refractive layer disposed on the substrate and including a metal fluoride;

a first functional layer disposed on the low-refractive layer, having a thickness of 5 nm to 25 nm, and including an oxide; and a second functional layer disposed on the first functional layer and including perfluorinated compound.

21. The display apparatus of claim 20, wherein the light-emitting element includes a pixel electrode, an emission layer, and an opposite electrode, and the display apparatus further includes a pixel-defining layer that defines a first opening exposing at least a portion of the pixel electrode.

22. The display apparatus of claim 21, wherein a second opening is defined in the light-blocking layer, wherein the second opening overlaps the first opening.

23. The display apparatus of claim 22, wherein at least a portion of the color filter layer is located inside the second opening.

24. The display apparatus of claim 20, wherein the low-refractive layer includes magnesium fluoride, have a refractive index of about 1.2 to about 1.4, and have a thickness of 50 nm to 150 nm.

25. The display apparatus of claim 20, wherein the first functional layer includes a silicon-aluminum oxide.

26. The display apparatus of claim 20, wherein the first functional layer includes a silicon oxide in which aluminum atoms are employed.

27. The display apparatus of claim 26, wherein the first functional layer includes a substitution-type solid solution in which some of silicon atoms of the silicon oxide are replaced by the aluminum atoms, or a penetration-type solid solution in which the aluminum atoms penetrate a crystalline lattice of the silicon oxide.

28. The display apparatus of claim 20, further comprising a third functional layer disposed between the substrate and the low-refractive layer and including an oxide.

29. The display apparatus of claim 28, wherein a refractive index of the third functional layer is greater than a refractive index of the low-refractive layer.

30. The display apparatus of claim 20, wherein, after applying a load of 1 Kg to a surface of the window using an eraser, and reciprocating a distance of 15 mm at a speed of 40 cycles/min 6000 times, a contact angle of the surface of the window with respect to water is 95° or more.

* * * * *